(12) United States Patent
Kitano et al.

(10) Patent No.: US 6,841,269 B2
(45) Date of Patent: Jan. 11, 2005

(54) HOLE TRANSPORTING POLYMER AND ORGANIC ELECTROLUMINESCENCE DEVICE USING THE SAME

(75) Inventors: Makoto Kitano, Ibaraki (JP); Takanobu Noguchi, Ibaraki (JP); Toshihiro Ohnishi, Tokyo (JP); Fumi Yamaguchi, Ibaraki (JP); Takenori Osada, Chiba (JP)

(73) Assignee: Sumitomo Chemical Company, Ltd., Osaka (JP)

( * ) Notice: Subject to any disclaimer, the term of this patent is extended or adjusted under 35 U.S.C. 154(b) by 106 days.

(21) Appl. No.: 10/326,061

(22) Filed: Dec. 23, 2002

(65) Prior Publication Data

US 2003/0211358 A1 Nov. 13, 2003

Related U.S. Application Data

(62) Division of application No. 09/118,855, filed on Jul. 20, 1998, now Pat. No. 6,544,670.

(30) Foreign Application Priority Data

Jul. 22, 1997 (JP) .......................... 09-195465

(51) Int. Cl.[7] .......................... H05B 33/12; C08G 77/26
(52) U.S. Cl. ...................... 428/690; 428/917; 428/447; 428/448; 313/504; 313/506; 257/40; 528/38; 528/43
(58) Field of Search ................. 428/690, 917, 428/447, 448; 313/504, 506; 257/40; 528/38, 43; 430/58.2, 58.7, 58.75

(56) References Cited

U.S. PATENT DOCUMENTS 3,957,725 A 5/1976 Limburg

| 5,085,946 A | 2/1992 | Saito et al. ................. 428/690 |
| 5,230,976 A | 7/1993 | Schank et al. ................ 430/59 |
| 5,674,635 A | 10/1997 | Hsieh et al. ................ 428/690 |
| 5,834,100 A | 11/1998 | Marks et al. ............... 428/209 |

FOREIGN PATENT DOCUMENTS

| EP | 0 699 654 | 3/1996 |
| EP | 0771806 A1 | 5/1997 |
| EP | 0771807 A1 | 5/1997 |
| EP | 0771808 A1 | 5/1997 |
| EP | 0771809 A1 | 5/1997 |
| EP | 0 772 091 | 5/1997 |
| EP | 0 786 924 | 7/1997 |
| EP | 0 861 845 | 9/1998 |
| GB | 2300196 A | 10/1996 |
| JP | 8-259935 A | 10/1996 |
| JP | 8-295880 A | 11/1996 |
| WO | WO 95/01871 | 1/1995 |

OTHER PUBLICATIONS

Patent Abstracts of Japan, vol. 097, No. 002, Feb. 28, 1997 & JP 08 259935 A (Toppan Printing Co., Ltd.), Oct. 8, 1996.

Patent Abstracts of Japan, vol. 016, No. 246 (E–1212), Jun. 5, 1992 & JP 04 051491 A (Ricoh Co., Ltd.), Feb. 19, 1992.

Primary Examiner—Marie Yamnitzky
(74) Attorney, Agent, or Firm—Fitch, Even, Tabin & Flannery

(57) ABSTRACT

A hole transporting polymer having a specific Si-containing repeating unit represented by a formula (1) and specific molecular weight, an excellent hole transporting property, and superior durability and film-forming properties, and the organic EL device, using the bole transporting polymer having excellent light emitting characteristics are disclosed.

7 Claims, No Drawings

HOLE TRANSPORTING POLYMER AND ORGANIC ELECTROLUMINESCENCE DEVICE USING THE SAME

CROSS-REFERENCED APPLICATIONS

This application is a divisional of application Ser. No. 09/118,855, filed Jul. 20, 1998, now U.S. Pat. No. 6,544,670, the complete disclosure of which is hereby incorporated herein by reference in its entirety.

BACKGROUND OF THE INVENTION

1. Field of the Invention

The present invention relates to a hole transporting polymer, a method of producing the same, and an organic electroluminescence device (hereinafter referred to as an "organic EL device", sometimes) using the hole transporting polymer.

2. Description of the Related Art

An inorganic electroluminescence device (hereinafter referred to as an "inorganic EL device", sometimes) using an inorganic fluorescent substance has hitherto been used for a flat light source as backlight, a display device such as flat panel display or the like, but a high-voltage alternating current was required for driving the devices.

Tang et al. have recently fabricated an organic EL device having a two-layer structure, comprising a laminate of a light emitting layer of an organic fluorescent dyes and a layer of an organic charge transporting compound generally used in a photosensitive layer for electrophotography (U.S. Pat. No. 4,539,507). Since the organic EL device has a feature that emission of various colors can be easily obtained, in addition to low-voltage driving and high luminance, in comparison with the inorganic EL device, various attempts have been made and reported regarding the development and improvement of the device structure, organic fluorescent dyes and organic charge transporting compounds,etc [Jpn. J. Appl. Phys. Vol. 27, page L269 (1988); and J. Appl. Phys., Vol. 65, page 3610 (1989)]

As the hole transporting material, for example, various compounds such as oxadiazole derivatives, oxazol derivatives, hydrazone derivatives, triarylpyrazoline derivatives, arylamine derivatives, stilbene derivatives and the like have been reported.

In case of using only a low molecular weight hole transporting material in the organic EL device, the mechanical strength and heat resistance of the hole transporting layer were insufficient. As the method of forming a hole transporting layer, deposition under vacuum is generally used but has a problem of high production cost. To the contrary, there have been reported a lot of examples using the hole transporting polymer, such as organic EL device using a polystyrene derivatives having an aromatic amine group on the side chain (JP-A-8-259935), organic EL device using a polyester having an aromatic amine group(JP-A-8-259880) and the like, for the purpose of improving the durability and film-forming property. However, these organic EL devices are not necessarily satisfactory in view of the stability on driving.

On the other hand, in a photosensitive layer for electrophotography using the hole transporting material, like the organic EL device, the addition of a polysiloxane is performed for the purpose of preventing deterioration caused by corona discharge. Furthermore, there has been reported a hole transporting polysiloxane obtained by mixing a silicon hole transporting material with a curable polysiloxane and curing the mixture for the purpose of imparting the hole transporting property to the polysiloxane (JP-A-9-124943).

As an example of using a hole transporting polysiloxane in an organic EL, an organic EL device obtained by mixing a polysiloxane having a carbazole group on the side chain with a light emitting polymer has been proposed (WO 9501871).

SUMMARY OF THE INVENTION

An object of the present invention is to provide a hole transporting polymer having excellent hole transporting property, excellent durability and excellent film-forming property, and a method of producing the same, and an organic EL device having excellent light emitting characteristics, using the hole transporting polymer.

The present inventors have intensively studied to solve these problems, and found that a specific novel hole transporting polymer has excellent hole transporting property, excellent durability and excellent film-forming property, and that an organic EL device prepared by using the hole transporting polymer has excellent light emitting characteristics. Thus, the present invention has been accomplished.

SUMMARY OF THE INVENTION

That is, the present invention relates to [1] a hole transporting polymer comprising a repeating structural unit represented by the following general formula (1), and having a polystyrene-reduced number-average molecular weight of from $10^3$ to $10^7$:

wherein $R_1$ represents an alkyl group having 1 to 20 carbon atoms, a cycloalkyl group having 3 to 20 carbon atoms, an aryl group having 6 to 30 carbon atoms or an aralkyl group having 7 to 32 carbon atoms; $Ar_1$ represents an arylene group having 6 to 30 carbon atoms, or an arylene ethenylene group represented by the following general formula (2); $Ar_2$ and $Ar_3$ independently represent an aryl group having 6 to 30 carbon atoms, an aromatic amine group represented by the following general formula (3), or an arylene ethenylene group represented by the following general formula (4); and a ring may be formed between $Ar_1$ and $Ar_2$, or $Ar_1$ and $Ar_3$, or $Ar_2$ and $Ar_3$:

wherein $Ar_4$ and $Ar_5$ independently represent an arylene group having 6 to 30 carbon atoms; $R_2$ and $R_3$ independently represent hydrogen atom, an alkyl group having 1 to 20 carbon atoms, a cycloalkyl group having 3 to 20 carbon atoms, an aryl group having 6 to 30 carbon atoms or an aralkyl group having 7 to 32 carbon atoms:

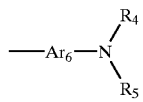
(3)

wherein $Ar_6$ represents an arylene group having 6 to 30 carbon atoms; $R_4$ and $R_5$ independently represent an alkyl group having 1 to 20 carbon atoms, a cycloalkyl group having 3 to 20 carbon atoms, an aryl group having 6 to 30 carbon atoms or an aralkyl group having 7 to 32 carbon atoms; and a ring may be formed between $Ar_6$ and $R_4$, or $Ar_6$ and $R_5$, or $R_4$ and $R_5$:

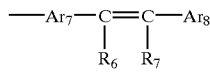
(4)

wherein $Ar_7$ represents an arylene group having 6 to 30 carbon atoms; $R_6$ and $R_7$ independently represent hydrogen atom, an alkyl group having 1 to 20 carbon atoms, a cycloalkyl group having 3 to 20 carbon atoms, an aryl group having 6 to 30 carbon atoms or an aralkyl group having 7 to 32 carbon atoms; $Ar_8$ represents an aryl group having 6 to 30 carbon atoms.

The present invention also relates to [2] a hole transporting polymer comprising a repeating structural unit represented by the following general formula (5), and having a polystyrene-reduced number-average molecular weight of from $10^3$ to $10^7$:

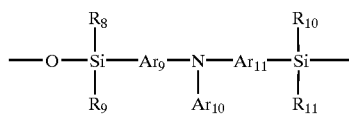
(5)

wherein $Ar_9$ and $Ar_{11}$ independently represent an arylene group having 6 to 30 carbon atoms, an aromatic amine group represented by the following general formula (6) or an arylene ethenylene group represented by the following general formula (7); $Ar_{10}$ represents an aryl group having 6 to 30 carbon atoms, an aromatic amine group represented by the following general formula (8) or an arylene ethenylene group represented by the following general formula (9); a ring may be formed between $Ar_9$ and $Ar_{10}$, or $Ar_9$ and $Ar_{11}$, or $Ar_{10}$ and $Ar_{11}$; and $R_8$, $R_9$, $R_{10}$ and $R_{11}$ independently represent hydroxy group, an alkyl or alkoxy group having 1 to 20 carbon atoms, a cycloalkyl group having 3 to 20 carbon atoms, an aryl group having 6 to 30 carbon atoms or an aralkyl group having 7 to 32 carbon atoms, a group represented by the following general formula (10) or (12), or divalent oxygen atom which may be bonded to an intramolecular silicon atom by crosslinking or to a silicon atom in the molecule vicinally sited by crosslinking:

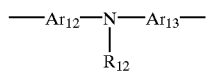
(6)

wherein $Ar_{12}$ and $Ar_{13}$ independently represent an arylene group having 6 to 30 carbon atoms; $R_{12}$ represents an alkyl group having 1 to 20 carbon atoms, a cycloalkyl group having 3 to 20 carbon atoms, an aryl group having 6 to 30 carbon atoms or an aralkyl group having 7 to 32 carbon atoms; and a ring may be formed between $Ar_{12}$ and $Ar_{13}$, or $Ar_{12}$ and $R_{12}$, or $Ar_{13}$ and $R_{12}$:

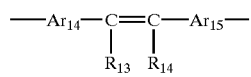
(7)

wherein $Ar_{14}$ and $Ar_{15}$ independently represent an arylene group having 6 to 30 carbon atoms; and $R_{13}$ and $R_{14}$ independently represent hydrogen atom, an alkyl group having 1 to 20 carbon atoms, a cycloalkyl group having 3 to 20 carbon atoms, an aryl group having 6 to 30 carbon atoms or an aralkyl group having 7 to 32 carbon atoms:

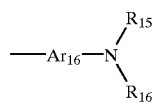
(8)

wherein $Ar_{16}$ represents an arylene group having 6 to 30 carbon atoms; $R_{15}$ and $R_{16}$ independently represent an alkyl group having 1 to 20 carbon atoms, a cycloalkyl group having 3 to 20 carbon atoms, an aryl group having 6 to 30 carbon atoms or an aralkyl group having 7 to 32 carbon atoms; and a ring may be formed between $Ar_{16}$ and $R_{15}$, or $Ar_{16}$ and $R_{16}$, or $R_{15}$ and $R_{16}$):

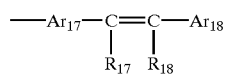
(9)

wherein $Ar_{17}$ represents an arylene group having 6 to 30 carbon atoms; $R_{17}$ and $R_{18}$ independently represent hydrogen atom, an alkyl group having 1 to 20 carbon atoms, a cycloalkyl group having 3 to 20 carbon atoms, an aryl group having 6 to 30 carbon atoms or an aralkyl group having 7 to 32 carbon atoms; and $Ar_{18}$ represents an aryl group having 6 to 30 carbon atoms:

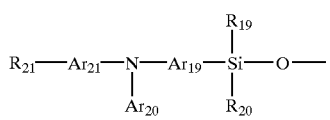
(10)

wherein $Ar_{19}$ and $Ar_{21}$ independently represent an arylene group having 6 to 30 carbon atoms, an aromatic amine group represented by the above general formula (6) or an arylene ethenylene group represented by the above general formula (7); $Ar_{20}$ represent an aryl group having 6 to 30 carbon atoms, an aromatic amine group represented by the above general formula (8) or an arylene ethenylene group represented by the above general formula (9); and a ring may be formed between $Ar_{19}$ and $Ar_{20}$, or $Ar_{19}$ and $Ar_{21}$, or $Ar_{20}$ and $Ar_{21}$; $R_{19}$ and $R_{20}$ independently represent hydroxy group, an alkyl or alkoxy group having 1 to 20 carbon atoms, a cycloalkyl group having 3 to 20 carbon atoms, an aryl group having 6 to 30 carbon atoms or an aralkyl group having 7 to 32 carbon atoms, or divalent oxygen atom which may be bonded to an intramolecular silicon atom by crosslinking or to a silicon atom in the molecule vicinally sited by crosslinking; $R_{21}$ represents hydrogen atom or a group represented by the following general formula (11):

(11)

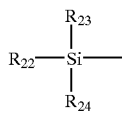

wherein $R_{22}$, $R_{23}$ and $R_{24}$ independently represent hydroxy group, an alkyl group or alkoxy group having 1 to 20 carbon atoms, a cycloalkyl group having 3 to 20 carbon atoms, an aryl group having 6 to 30 carbon atoms or an aralkyl group having 7 to 32 carbon atoms:

(12)

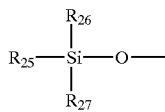

wherein $R_{21}$, $R_{26}$ and $R_{27}$ independently represent an alkyl group having 1 to 20 carbon atoms, a cycloalkyl group having 3 to 20 carbon atoms, an aryl group having 6 to 30 carbon atoms or an aralkyl group having 7 to 32 carbon atoms, or an arylene ethenylene group represented by the above general formula (9) or an aromatic amine group represented by the following general formula (13):

(13)

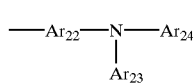

wherein $Ar_{22}$ represents an arylene group having 6 to 30 carbon atoms, an aromatic amine group represented by the above general formula (6) or an arylene ethenylene group represented by the above general formula (7); $Ar_{23}$ and $Ar_{24}$ independently represent an aryl group having 6 to 30 carbon atoms, an aromatic amine group represented by the above general formula (8) or an arylene ethenylene group represented by the above general formula (9).

The present invention also relates to [3] the hole transporting polymer according to [2], wherein the compound group represented by the above general formula (12) is in an amount of from 10% by mole to 150% by mole based on the total silicon atoms belonging to said hole transporting polymer except silicon atoms contained in said compound group, and the content of the hydroxyl group is less than 10% by mole based on the total silicon atoms belonging to said hole transporting polymer except silicon atoms contained in said compound group.

The present invention also relates to [4] a method of producing a hole transporting polymer of [1], wherein at least one silane compound represented by the following general formula (14) is hydrolyzed and condensed:

(14)

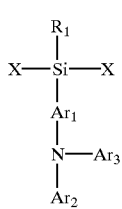

wherein X represents a halogen atom or an alkoxy group having 1 to 20 carbon atoms; $R_1$, $Ar_1$, $Ar_2$ and $Ar_3$ are as defined in [1]; and a ring may be formed between $Ar_1$ and $Ar_2$, or $Ar_1$ and $Ar_3$, or $Ar_2$ and $Ar_3$.

The present invention also relates to [5] the method of producing a hole transporting polymer of [2], wherein at least one silane compound represented by the following general formula (15), or a mixture of at least one silane compound represented by the following general formula (15) and at least one silane compound represented by the following general formula (16) is hydrolyzed and condensed.

(15)

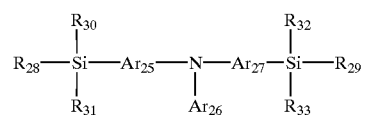

wherein $R_{30}$, $R_{31}$, $R_{32}$ and $R_{33}$ independently represent a halogen atom, an alkyl group or alkoxy group having 1 to 20 carbon atoms, a cycloalkyl group having 3 to 20 carbon atoms, an aryl group having 6 to 30 carbon atoms or an aralkyl group having 7 to 32 carbon atoms; $R_{28}$ and $R_{29}$ independently represent hydroxy group or an alkoxy group having 1 to 20 carbon atoms; $Ar_{25}$ and $Ar_{27}$ are the same with $Ar_9$ as defined in the general formula (5) of [2] or $Ar_{19}$ as defined in the general formula (10) of [2]; $Ar_{26}$ is the same with $Ar_{10}$ as defined in the general formula (5) of [2]; and a ring may be formed between $Ar_2$, and $Ar_{26}$, or $Ar_{25}$ and $Ar_{27}$, or $Ar_{26}$ and $Ar_{27}$:

(16)

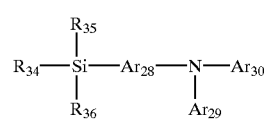

wherein $R_{35}$ and $R_{36}$ independently represent a halogen atom, an alkyl group or alkoxy group having 1 to 20 carbon atoms, a cycloalkyl group having 3 to 20 carbon atoms, an aryl group having 6 to 30 carbon atoms or an aralkyl group having 7 to 32 carbon atoms; $R_{34}$, represents a halogen atom, an alkoxy group having 1 to 20 carbon atoms; $Ar_{28}$ represents an arylene group having 1 to 30 carbon atoms or an arylene ethenylene group represented by the following general formula (17); $Ar_{29}$ and $Ar_{30}$ independently represent an aryl group having 6 to 30 carbon atoms, an aromatic amine group represented by the following general formula (18) or an arylene ethenylene group represented by the following general formula (19); and a ring may be formed between $Ar_{28}$ and $Ar_{29}$, or $Ar_{28}$ and $Ar_{30}$, or $Ar_{29}$ and $Ar_{30}$:

(17)

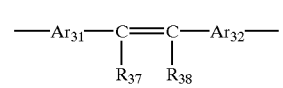

wherein $Ar_{31}$ and $Ar_{32}$ independently represent an arylene group having 6 to 30 carbon atoms; $R_{37}$ and $R_{38}$ independently represent hydrogen atom, an alkyl group having 1 to 20 carbon atoms, a cycloalkyl group having 3 to 20 carbon atoms, an aryl group having 6 to 30 carbon atoms or aralkyl group having 7 to 32 carbon atoms:

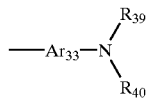
(18)

wherein $Ar_{33}$ represents an arylene group having 6 to 30 carbon atoms; $R_{39}$ and $R_{40}$ independently represent an alkyl group having 1 to 20 carbon atoms, a cycloalkyl group having 3 to 20 carbon atoms, an aryl group having 6 to 30 carbon atoms or an aralkyl group having 7 to 32 carbon atoms; and a ring may be formed between $Ar_{33}$ and $R_{39}$, or $Ar_{33}$ and $R_{40}$, or $R_{39}$ and $R_{40}$:

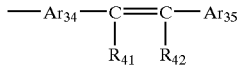
(19)

wherein $Ar_{34}$ represents an arylene group having 6 to 30 carbon atoms; $R_{41}$ and $R_{42}$ independently represent hydrogen atom, an alkyl group having 1 to 20 carbon atoms, a cycloalkyl group having 3 to 20 carbon atoms, an aryl group having 6 to 30 carbon atoms or an aralkyl group having 7 to 32 carbon atoms; and $Ar_{35}$ represents an aryl group having 6 to 30 carbon atoms.

The present invention also relates to [6] the method of producing a hole transporting polymer of [2] or [3], wherein the hole transporting polymer obtained by [5] is reacted with the compound represented by the following general formula (20),

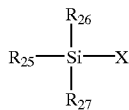
(20)

wherein X represents a halogen atom or an alkoxy group having 1 to 20 carbon atoms; $R_{25}$, $R_{26}$, and $R_{27}$ are as defined in the general formula (12).

The present invention also relates to [7] an organic electroluminescence device comprising a pair of electrodes of an anode and a cathode, at least one of which is transparent or semitransparent, and at least one layer of an organic material formed between the electrodes, wherein the organic material layer contains the hole transporting polymer described in any one of [1] to [3].

The present invention also relates to [8] an organic electroluminescence device comprising a pair of electrodes of an anode and a cathode, at least one of which is transparent or semitransparent, and a light emitting layer formed between the electrodes, wherein the light emitting layer contains the hole transporting polymer described in any one of [1] to [3].

The present invention also relates to [9] an organic electroluminescence device comprising a pair of electrodes of an anode and a cathode, at least one of which is transparent or semitransparent, and a light emitting layer formed between the electrodes, wherein a hole transporting layer containing the hole transporting polymer described in any one of [1] to [3] is provided adjacent to the light emitting layer between the anode and the light emitting layer.

The present invention also relates to [10] the organic electroluminescence device according to [8] or [9], wherein an electron transporting layer containing an electron transporting compound is provided adjacent to the light emitting layer between the anode and the light emitting layer.

The present invention also relates to [11] the organic electroluminescence device according to any one of [8] to [10], wherein the light emitting layer contains a light emitting polymer, which contains a repeating structural unit represented by the following general formula (21) in the proportion of 50% by mol or more based on the total repeating structural units and has a polystyrene-reduced number-average molecular weight of $10^3$ to $10^7$,

—Ar—CR=CR' (21)

wherein Ar represents an arylene group or heterocylic compound group having 4 to 20 carbon atoms, which take part in a conjugated bond; and R and R' independently represent a group selected from the group consisting of hydrogen atom, alkyl group having 1 to 20 carbon atoms, aryl group having 6 to 20 carbon atoms, heterocyclic compound having 4 to 20 carbon atoms and cyano group.

DETAILED DESCRIPTION OF THE INVENTION

The first hole transporting polymer of the present invention is a hole transporting polymer containing a repeating structural unit represented by the above general formula (1), and having a polystyrene-reduced number-average molecular weight of from $10^3$ to $10^7$. In view of the film forming property, the polystyrene-reduced number-average molecular weight is preferably from $10^3$ to $10^6$.

In the general formula (1), $R_1$ is a straight-chain or branched alkyl group having 1 to 20 carbon atoms, a cycloalkyl group having 3 to 20 carbon atoms, an aryl group having 6 to 30 carbon atoms or an aralkyl group having 7 to 32 carbon atoms, preferably a straight-chain or branched alkyl group having 1 to 10 carbon atoms, a cycloalkyl group having 3 to 10 carbon atoms, an aryl group having 6 to 20 carbon atoms or an aralkyl group having 7 to 22 carbon atoms, and more preferably a straight-chain or branched alkyl group having 1 to 6 carbon atoms or a cycloalkyl group having 3 to 6 carbon atoms.

Specific examples of $R_1$ include alkyl group such as methyl group, ethyl group, n-propyl group, isopropyl group, n-butyl group, sec-butyl group, tert-butyl group, pentyl group, hexyl group, heptyl group, octyl group or the like; cycloalkyl group such as cyclopropyl group, cyclobutyl group, cyclopentyl group, cyclohexyl group or the like; aryl group such as phenyl group, naphthyl, group, anthryl group, biphenyl group or the like, which may be substituted with methyl group, ethyl group, propyl group; and aralkyl group such as benzyl group, phenethyl group and the like, which may be substituted with methyl group, ethyl group, propyl group.

In the general formula (1), the arylene group for $Ar_1$ is an arylene group having 6 to 30 carbon atoms, preferably an arylene group having 6 to 20 carbon atoms, and more preferably a phenylene, naphthylene or anthrylene group which may be substituted with a straight-chain or branched alkyl group having 1 to 6 carbon atoms or a cycloalkyl group having 3 to 6 carbon atoms.

Specific examples of the arylene group for $Ar_1$ include phenylene group, naphthylene group, anthrylene group and the like, which may be substituted with methyl group, ethyl group or propyl group.

In addition, $Ar_1$ in the general formula (1) may be an arylene ethenylene group represented by the above general formula (2). In the general formula (2), $Ar_4$ and $Ar_5$ are independently an arylene group having 6 to 30 carbon atoms, preferably an arylene group having 6 to 20 carbon atoms, and more preferably a phenylene group which may be substituted with a straight-chain or branched alkyl group having 1 to 6 carbon atoms or a cycloalkyl group having 3 to 6 carbon atoms.

Specific examples of $Ar_4$ and $Ar_5$ independently include phenylene group, naphthylene group, anthrylene group and the like, which may be substituted with methyl group, ethyl group or propyl group.

In the general formula (2), $R_2$ and $R_3$ are independently hydrogen atom, a straight-chain or branched alkyl group having 1 to 20 carbon atoms, a cycloalkyl group having 3 to 20 carbon atoms, an aryl group having 6 to 30 carbon atoms or an aralkyl group having 7 to 32 carbon atoms, preferably hydrogen atom, a straight-chain or branched alkyl group having 1 to 10 carbon atoms, a cycloalkyl group having 3 to 10 carbon atoms, an aryl group having 6 to 20 carbon atoms or an aralkyl group having 7 to 22 carbon atoms, and more preferably hydrogen atom, a straight-chain or branched alkyl group having 1 to 6 carbon atoms, or a phenylene group which may be substituted with a straight-chain or branched alkyl group having 1 to 6 carbon atoms or a cycloalkyl group having 3 to 6 carbon atoms.

Specific examples of $R_2$ and $R_3$ independently include hydrogen atom, methyl group, ethyl group, propyl group, or a phenyl group which may be substituted with methyl group, ethyl group, propyl group.

In the general formula (1), the aryl group for $Ar_2$ and $Ar_3$ are independently an aryl group having 6 to 30 carbon atoms, preferably an aryl group having 6 to 20 carbon atoms, and more preferably a phenyl or naphthyl group which may be substituted with a straight-chain or branched alkyl group having 1 to 6 carbon atoms or a cycloalkyl group having 3 to 6 carbon atoms.

Specific examples of the aryl group for $Ar_2$ and $Ar_3$ independently include phenyl group, naphthyl group, anthryl group and the like, which may be substituted with methyl group, ethyl group or propyl group.

In addition, $Ar_2$ and $Ar_3$ in the general formula (1) may be independently an aromatic amine group represented by the general formula (3). In the general formula (3), $Ar_6$ is an arylene group having 6 to 30 carbon atoms, preferably an arylene group having 6 to 20 carbon atoms, and more preferably a phenylene or biphenylene group which may be substituted with a straight-chain or branched alkyl group having 1 to 6 carbon atoms or a cycloalkyl group having 3 to 6 carbon atoms.

Specific examples of $Ar_6$ include phenylene group, naphthylene group, anthrylene group, biphenylene group and the like, which may be substituted with methyl group, ethyl group or propyl group.

In the general formula (3), $R_4$ and $R_5$ are independently a straight-chain or branched alkyl group having 1 to 20 carbon atoms, a cycloalkyl group having 3 to 20 carbon atoms, an aryl group having 6 to 30 carbon atoms or an aralkyl group having 7 to 32 carbon atoms, preferably a straight-chain or branched alkyl group having 1 to 10 carbon atoms, a cycloalkyl group having 3 to 10 carbon atoms, an aryl group having 6 to 20 carbon atoms or an aralkyl group having 7 to 22 carbon atoms, and more preferably a phenyl or naphthyl group which may be substituted with a straight-chain or branched alkyl group having 1 to 6 carbon atoms or a cycloalkyl group having 3 to 6 carbon atoms.

Specific examples of $R_4$ and $R_5$ independently include phenyl group, naphthyl group, anthryl group, biphenyl group and the like, which may be substituted with methyl group, ethyl group or propyl group.

In the general formula (3), a ring may be formed between $Ar_6$ and $R_4$, $Ar_6$ and $R_5$, or $R_4$ and $R_5$.

In addition, $Ar_2$ and $Ar_3$ in the general formula (1) may be independently an arylene ethenylene group represented by the general formula (4). In the general formula (4), $Ar_7$ is an arylene group having 6 to 30 carbon atoms, preferably an arylene group having 6 to 20 carbon atoms, and more preferably a phenylene group which may be substituted with a straight-chain or branched alkyl group having 1 to 6 carbon atoms or a cycloalkyl group having 3 to 6 carbon atoms.

Specific examples of $Ar_7$ include phenylene group, naphthylene group, anthrylene group and the like, which may be substituted with methyl group, ethyl group or propyl group.

In the general formula (4), $Ar_8$ is an aryl group having 6 to 30 carbon atoms, preferably an aryl group having 6 to 20 carbon atoms, and more preferably a phenyl group which may be substituted with a straight-chain or branched alkyl group having 1 to 6 carbon atoms or a cycloalkyl group having 3 to 6 carbon atoms.

Specific examples of $Ar_8$ include phenyl group, naphthyl group, anthryl group and the like, which may be substituted with methyl group, ethyl group or propyl group.

In the general formula (4), $R_6$ and $R_7$ are independently hydrogen atom, a straight-chain or branched alkyl group having 1 to 20 carbon atoms, a cycloalkyl group having 3 to 20 carbon atoms, an aryl group having 6 to 30 carbon atoms or an aralkyl group having 7 to 32 carbon atoms, preferably hydrogen atom, a straight-chain or branched alkyl group having 1 to 10 carbon atoms, a cycloalkyl group having 3 to 10 carbon atoms, an aryl group having 6 to 20 carbon atoms or an aralkyl group having 7 to 22 carbon atoms, and more preferably hydrogen atom, a straight-chain or branched alkyl group having 1 to 6 carbon atoms, or a phenyl group which may be substituted with a straight-chain or branched alkyl group having 1 to 6 carbon atoms or a cycloalkyl group having 3 to 6 carbon atoms.

Specific examples of $R_6$ and $R_7$ independently include hydrogen atom, methyl group, ethyl group, propyl group, or phenyl group which may be substituted with methyl group, ethyl group or propyl group.

In the general formula (1), a ring may be formed between $Ar_1$ and $Ar_2$, $Ar_1$ and $Ar_3$, or $Ar_2$ and $Ar_3$.

The first hole transporting polymer may be a copolymer as long as it comprises a repeating structural unit represented by the general formula (1). Examples of other copolymerisable repeating structural unit include a repeating structural unit represented by the following general formula (22). Examples of the copolymer include copolymers containing the repeating structural unit represented by the general formula (1) and at least one kind of repeating structural unit represented by the following general formula (22). The composition of the copolymer is not specifically limited as long as the properties of the hole transporting polymer are not deteriorated. The proportion of the repeating structural unit represented by the general formula (1) based on the total of the repeating units is usually 20–100% by mole and preferably 50–100% by mole.

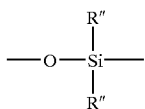

(22)

wherein R″s represent an alkyl or aryl group having 1 to 12 carbon atoms, which may be the same or different.

The second hole transporting polymer of the present invention is a hole transporting polymer containing a repeating structural unit represented by the above general formula (5), and having a polystyrene-reduced number-average molecular weight of from $10^3$ to $10^7$. In view of the film forming property, the polystyrene-reduced number-average molecular weight is preferably from $10^3$ to $10^6$.

The second hole transporting polymer may be a copolymer which contains a repeating structural unit other than the repeating unit represented by the general formula (5) as long as the properties of the hole transporting polymer are not deteriorated. Examples of other copolymerisable repeating structural unit include a repeating structural unit represented by the above general formula (22). The proportion of the repeating structural unit represented by the general formula (5) based on the total of the repeating units is usually 20–100% by mole and preferably 50–100% by mole.

In the general formula (5), $R_8$, $R_9$, $R_{10}$ or $R_{11}$ is independently hydroxy group, a straight-chain or branched alkyl or alkoxy group having 1 to 20 carbon atoms, a cycloalkyl group having 3 to 20 carbon atoms, an aryl group having 6 to 30 carbon atoms or an aralkyl group having 7 to 32 carbon atoms, a group represented by the general formula (10), a group represented by the general formula (12), or divalent oxygen atom which may be bonded to an intramolecular silicon atom by crosslinking or to a silicon atom in the molecule vicinally sited by crosslinking, preferably hydroxy group, a straight-chain or branched alkyl or alkoxy group having 1 to 10 carbon atoms or a cycloalkyl group having 3 to 10 carbon atoms, a group represented by the general formula (10), a group represented by the general formula (12), or divalent oxygen atom which may be bonded to an intramolecular silicon atom by crosslinking or to a silicon atom in the molecule vicinally sited by crosslinking, and more preferably hydroxy group or a straight-chain or branched alkyl or alkoxy group having 1 to 6 carbon atoms, a group represented by the general formula (10), a group represented by the general formula (12), or divalent oxygen atom which may be bonded to an intramolecular silicon atom by crosslinking or to a silicon atom in the molecule vicinally sited by crosslinking.

Specific examples of $R_8$, $R_9$, $R_{10}$ or $R_{11}$ independently include hydroxy group; an alkyl group such as methyl group, ethyl group, n-propyl group, isopropyl group, n-butyl group, sec-butyl group, tert-butyl group, pentyl group, hexyl group, heptyl group, octyl group, or the like; alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group or the like; cycloalkyl group such as cyclopropyl group, cyclobutyl group, cyclopentyl group, cyclohexl group or the like; aryl group such as phenyl group, naphthyl group, anthryl group, biphenyl group or the like, which may be substitute with methyl group, ethyl group or propyl group; and aralkyl group such as benzyl group, phenethyl group or the like, which may be substitute with methyl group, ethyl group or propyl group.

The divalent oxygen atom which may be bonded to an intramolecular silicon atom by crosslinking or to a silicon atom in the molecule vicinally sited by crosslinking specifically means the oxygen atom sandwiched by two silicon atom when siloxane bond is produced by crosslinking.

In the general formula (5), the arylene group for $Ar_9$ and $Ar_{11}$ is independently an arylene group having 6 to 30 carbon atoms, preferably an arylene group having 6 to 20 carbon atoms, and more preferably a phenylene or naphthylene group which may be substituted with a straight-chain or branched alkyl group having 1 to 6 carbon atoms or a cycloalkyl group having 3 to 6 carbon atoms.

Specific examples of the arylene group for $Ar_9$ and $Ar_{11}$ independently include phenylene group, naphthylene group, anthrylene group and the like, which may be substituted with methyl group, ethyl group or propyl group.

In addition, $Ar_9$ and $Ar_{11}$ in the general formula (5) may be an aromatic amine group represented by the general formula (6). In the general formula (6), $Ar_{12}$ and $Ar_{13}$ are independently an arylene group having 6 to 30 carbon atoms, preferably an arylene group having 6 to 20 carbon atoms, and more preferably a phenylene or biphenylene group which may be substituted with a straight-chain or branched alkyl group having 1 to 6 carbon atoms or a cycloalkyl group having 3 to 6 carbon atoms.

Specific examples of $Ar_{12}$ and $Ar_{13}$ independently include phenylene group, naphthylene group, anthrylene group, biphenylene group and the like, which may be substituted with methyl group, ethyl group or propyl group.

In the general formula (6), $R_{12}$ is a straight-chain or branched alkyl group having 1 to 20 carbon atoms, a cycloalkyl group having 3 to 20 carbon atoms, an aryl group having 6 to 30 carbon atoms or an aralkyl group having 7 to 32 carbon atoms, preferably a straight-chain or branched alkyl group having 1 to 10 carbon atoms, a cycloalkyl group having 3 to 10 carbon atoms, an aryl group having 6 to 20 carbon atoms or an aralkyl group having 7 to 22 carbon atoms, and more preferably a phenyl or naphthyl group which may be substituted with a straight-chain or branched alkyl group having 1 to 6 carbon atoms or a cycloalkyl group having 3 to 6 carbon atoms.

Specific examples of $R^{12}$ include phenyl group, naphthyl group, anthryl group, biphenyl group and the like, which may be substituted with methyl group, ethyl group or propyl group.

In the general formula (6), a ring may be formed between $Ar_{12}$ and $Ar_{13}$, and $R_{12}$, or $Ar_{13}$ and $R_{12}$.

In addition, $Ar_9$ and $Ar_{11}$ in the general formula (5) may be independently an arylene ethenylene group represented by the general formula (7). In the general formula (7), $Ar_{14}$ and $Ar_{15}$ are indenpendently an arylene group having 6 to 30 carbon atoms, preferably an arylene group having 6 to 20 carbon atoms, and more preferably a phenylene group which may be substituted with a straight-chain or branched alkyl group having 1 to 6 carbon atoms or a cycloalkyl group having 3 to 6 carbon atoms.

Specific examples of $Ar_{14}$ and $Ar_{15}$ indenpendently include phenylene group, naphthylene group, anthrylene group and the like, which may be substituted with methyl group, ethyl group or propyl group.

In the general formula (7), $R_{13}$ and $R_{14}$ are indenpently hydrogen atom, a straight-chain or branched alkyl group having 1 to 20 carbon atoms, a cycloalkyl group having 3 to 20 carbon atoms, an aryl group having 6 to 30 carbon atoms or an aralkyl group having 7 to 32 carbon atoms, preferably hydrogen atom, a straight-chain or branched alkyl group having 1 to 10 carbon atoms, a cycloalkyl group having 3 to 10 carbon atoms, an aryl group having 6 to 20 carbon atoms or an aralkyl group having 7 to 22 carbon atoms, and more preferably hydrogen atom, a straight-chain or branched alkyl group having 1 to 6 carbon atoms, or a phenyl group which may be substituted with a straight-chain or branched alkyl group having 1 to 6 carbon atoms or a cycloalkyl group having 3 to 6 carbon atoms.

Specific example of $R_{13}$ and $R_{14}$ indenpendently include hydrogen atom, methyl group, ethyl group, propyl group, or phenyl group which may be substituted with methyl group, ethyl group or propyl group.

In the general (5), the aryl group for $Ar_{10}$ is an aryl group having 6 to 30 carbon atoms, preferably an aryl group having 6 to 20 carbon atoms, and more preferably a phenyl or naphthyl group which may be substituted with a straight-chain or branched alkyl group having 1 to 6 carbon atoms or a cycloalkyl group having 3 to 6 carbon atoms.

Specific examples of the aryl group for $Ar_{10}$ include phenyl group, naphthyl group, anthryl group and the like, which may be substituted with methyl group, ethyl group or propyl group.

In addition, $Ar_{10}$ in the general formula (5) may be an aromatic amine group represented by the general formula (8). In the general formula (8), $Ar_{16}$ is an arylene group having 6 to 30 carbon atoms, preferably an arylene group having 6 to 20 carbon atoms, and more preferably a phenylene or biphenylene group which may be substituted with a straight-chain or branched alkyl group having 1 to 6 carbon atoms or a cycloalkyl group having 3 to 6 carbon atoms.

Specific examples of $Ar_{16}$ include phenylene group, naphthylene group, anthrylene group, biphenylene group and the like, which may be substituted with methyl group, ethyl group or propyl group.

In the general formula (8), $R_{15}$ and $R_{16}$ are independently a straight-chain or branched alkyl group having 1 to 20 carbon atoms, a cycloalkyl group having 3 to 20 carbon atoms, an aryl group having 6 to 30 carbon atoms or an aralkyl group having 7 to 32 carbon atoms, preferably a straight-chain or branched alkyl group having 1 to 10 carbon atoms, a cycloalkyl group having 3 to 10 carbon atoms, an aryl group having 6 to 20 carbon atoms or an aralkyl group having 7 to 22 carbon atoms, and more preferably a phenyl or naphthyl group which may be substituted with a straight-chain or branched alkyl group having 1 to 6 carbon atoms or a cycloalkyl group having 3 to 6 carbon atoms.

Specific examples of $R_{15}$ and $R_{16}$ independently include phenyl group, naphthyl group, anthryl group, biphenyl group and the like, which may be substituted with methyl group, ethyl group or propyl group.

In the general formula (8), a ring may be formed between $Ar_{16}$ and $R_{15}$, $Ar_{16}$ and $R_{16}$, or $R_{15}$ and $R_{16}$.

In addition, $Ar_{10}$ in the general formula (5) may be an arylene ethenylene group represented by the general formula (9). $Ar_{17}$ in the general formula (9) is an arylene group having 6 to 30 carbon atoms, preferably an arylene group having 6 to 20 carbon atoms, and more preferably a phenylene group which may be substituted with a straight-chain or branched alkyl group having 1 to 6 carbon atoms or a cycloalkyl group having 3 to 6 carbon atoms.

Specific examples of $Ar_{17}$ include phenylene group, naphthylene group, anthrylene group and the like, which may be substituted with methyl group, ethyl group or propyl group.

In the general formula (9), $Ar_{18}$ is an aryl group having 6 to 30 carbon atoms, preferably an aryl group having 6 to 20 carbon atoms, and more preferably a phenyl group which may be substituted with a straight-chain or branched alkyl group having 1 to 6 carbon atoms or a cycloalkyl group having 3 to 6 carbon atoms.

Specific examples of $Ar_{18}$ include phenyl group, naphthyl group, anthryl group and the like, which may be substituted with methyl group, ethyl group or propyl group.

In the general formula (9), $R_{17}$ and $R_{18}$ are independently hydrogen atom, a straight-chain or branched alkyl group having 1 to 20 carbon atoms, a cycloalkyl group having 3 to 20 carbon atoms, an aryl group having 6 to 30 carbon atoms or an aralkyl group having 7 to 32 carbon atoms, preferably hydrogen atom, a straight-chain or branched alkyl group having 1 to 10 carbon atoms, a cycloalkyl group having 3 to 10 carbon atoms, an aryl group having 6 to 20 carbon atoms or an aralkyl group having 7 to 22 carbon atoms, and more preferably hydrogen atom, a straight-chain or branched alkyl group having 1 to 6 carbon atoms, or a phenyl group which may be substituted with a straight-chain or branched alkyl group having 1 to 6 carbon atoms or a cycloalkyl group having 3 to 6 carbon atoms.

Specific examples of $R_{17}$ and $R_{18}$ independently include hydrogen atom, methyl group, ethyl group, propyl group, or phenyl group which may be substituted with methyl group, ethyl group or propyl group.

In the general formula (5), a ring may be formed between $Ar_9$ and $Ar_{10}$, $Ar_9$ and $Ar_{11}$, or $Ar_{10}$ and $Ar_{11}$.

In the general formula (10), $R_{19}$ and $R_{20}$ are independently hydroxy group, a straight-chain or branched alkyl or alkoxy group having 1 to 20 carbon atoms, a cycloalkyl group having 3 to 20 carbon atoms, an aryl group having 6 to 30 carbon atoms or an aralkyl group having 7 to 32 carbon atoms, or divalent oxygen atom which may be bonded to an intramolecular silicon atom by crosslinking or to a silicon atom in the molecule vicinally sited by crosslinking, preferably, hydroxy group, a straight-chain or branched alkyl or alkoxy group having 1 to 10 carbon atoms, a cycloalkyl group having 3 to 10 carbon atoms or divalent oxygen atom which may be bonded to an intramolecular silicon atom by crosslinking or to a silicon atom in the molecule vicinally sited by crosslinking, and more preferably, hydroxy group, a straight-chain or branched alkyl or alkoxy group having 1 to 6 carbon atoms or divalent oxygen atom which may be bonded to an intramolecular silicon atom by crosslinking or to a silicon atom in the molecule vicinally sited by crosslinking Specific examples of $R_{19}$ and $R_{20}$ independently include hydroxy group; alkyl group such as methyl group, ethyl group, n-propyl group, isopropyl group, n-butyl group, sec-butyl group, tert-butyl group, pentyl group, hexyl group, heptyl group, octyl group, or the like; alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group or the like; cycloalkyl group such as cycloheptyl group, cyclobutyl group, cyclopentyl group, cyclohexl group or the like; aryl group such as phenyl group, naphthyl group, anthryl group, biphenyl group or the like, which may be substitute with methyl group, ethyl group or propyl group; and aralkyl group such as benzyl group, phenethyl group or the like, which may be substitute with methyl group, ethyl group or propyl group.

In the general formula (10), $R_{21}$ is a hydrogen atom or a group represented by the general formula (11), wherein $R_{22}$, $R_{23}$ and $R_{24}$ independently represent hydroxy group, a straight-chain or branched alkyl or alkoxy group having 1 to 20 carbon atoms, a cycloalkyl group having 3 to 20 carbon atoms, an aryl group having 6 to 30 carbon atoms or an aralkyl group having 7 to 32 carbon atoms, preferably hydroxy group, or a straight-chain or branched alkyl or alkoxy group having 1 to 10 carbon atoms, and more preferably hydroxy group or a straight-chain or branched alkyl or alkoxy group having 1 to 6 carbon atoms.

Specific examples of $R_{22}$, $R_{23}$ and $R_{24}$ independently include hydroxy group; alkyl group such as methyl group, ethyl group, n-propyl group, iso-propyl group, n-butyl group, sec-butyl group, tert-butyl group, pentyl group, hexyl group, heptyl group, octyl group, or the like; alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group or the like; cycloalkyl group such as cyclopropyl group, cyclobutyl group, cyclopentyl group, cyclohexyl group or the like; aryl group such as phenyl group, naphthyl group, anthryl group, biphenyl group or the like, which may be substituted with methyl group, ethyl group, propyl group.; and aralkyl group such as benzyl group, phenethyl group and the like, which may be substituted with methyl group, ethyl group, propyl group.

In the general formula (10), the arylene group for $Ar_{19}$ or $Ar_{21}$ is independently an arylene group having 6 to 30 carbon atoms, preferably an arylene group having 6 to 20 carbon atoms, and more preferably a phenylene or naphthylene group which may be substituted with a straight-chain or branched alkyl group having 1 to 6 carbon atoms or a cycloalkyl group having 3 to 6 carbon atoms.

Specific examples of the arylene group for $Ar_{19}$ and $Ar_{21}$ include phenylene group, naphthylene group, anthrylene group and the like, which may be substituted with methyl group, ethyl group or propyl group.

In addition, $Ar_{19}$ and $Ar_{21}$ in the general formula (10) may be independently an aromatic amine group represented by the general formula (6) or an arylene ethenylene group represented by the general formula (7).

Examples of aryl group for $Ar_{20}$ in the general formula (10) include an aryl group having 6 to 30 carbon atoms, preferably a phenyl group, naphthyl or anthrylene group which may be substituted with a straight-chain or branched alkyl group having 1 to 6 carbon atoms or a cycloalkyl group having 3 to 6 carbon atoms.

Specific examples of aryl group for $Ar_{20}$ include phenyl group, naphthyl group, anthryl group and the like, which may be substituted with methyl group, ethyl group or propyl group.

In the general formula (10), $Ar_{20}$ may be an aromatic amine group represented by the general formula (8), or an arylene ethenylene group represented by the general formula (9).

In the general formula (10), a ring may be formed between $Ar_{19}$ and $Ar_{20}$, $Ar_{19}$ and $Ar_{21}$, or $Ar_{20}$ and $Ar_{21}$.

In the general formula (12), $R_{25}$, $R_{26}$ and $R_{27}$ independently represent a straight-chain or branched alkyl or alkoxy group having 1 to 20 carbon atoms, a cycloalkyl group having 3 to 20 carbon atoms, an aryl group having 6 to 30 carbon atoms or an aralkyl group having 7 to 32 carbon atoms, an arylene ethenylene group represented by the general formula (9), an aromatic amine group represented by the general formula (13), preferably a straight-chain or branched alkyl or alkoxy group having 1 to 10 carbon atoms, a cycloalkyl group having 3 to 10 carbon atoms, an arylene ethenylene group represented by the general formula (9), or an aromatic amine group represented by the general formula (13), more preferably a straight-chain or branched alkyl or alkoxy group having 1 to 6 carbon atoms, an arylene ethenylene group represented by the general formula (9), or an aromatic amine group represented by the general formula (13).

Specific examples of $R_{25}$, $R_{26}$ and $R_{27}$ include independently an alkyl group such as methyl group, ethyl group, n-propyl group, isopropyl group, n-butyl group, sec-butyl group, tert-butyl group, pentyl group, hexyl group, heptyl group, octyl group, or the like; alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group or the like; cycloalkyl group such as cyclopropyl group, cyclobutyl group, cyclopentyl group, cyclohexl group or the like; aryl group such as phenyl group, naphthyl group, anthryl group, biphenyl group or the like, which may be substitute with methyl group, ethyl group or propyl group; and aralkyl group such as benzyl group, phenethyl group or the like, which may be substitute with methyl group, ethyl group or propyl group.

In the general formula (13), the arylene group for $Ar_{22}$ is an arylene group having 6 to 30 carbon atoms, preferably an arylene group having 6 to 20 carbon atoms, and more preferably a phenylene or naphthylene group which may be substituted with a straight-chain or branched alkyl group having 1 to 6 carbon atoms or a cycloalkyl group having 3 to 6 carbon atoms.

Specific examples of the arylene group for $Ar_{22}$ include phenylene group, naphthylene group, anthrylene group and the like, which may be substituted with methyl group, ethyl group or propyl group.

In addition, $Ar_{22}$ in the general formula (13) may be an aromatic amine group represented by the general formula (6) or an arylene ethenylene group represented by the general formula (7).

In the general formula (13), the aryl group for $Ar_{23}$ and $Ar_{24}$ is an aryl group having 6 to 30 carbon atoms, preferably an aryl group having 6 to 20 carbon atoms, and more preferably a phenyl or biphenyl group which may be substituted with a straight-chain or branched alkyl group having 1 to 6 carbon atoms or a cycloalkyl group having 3 to 6 carbon atoms.

Specific examples of the aryl group for $Ar_{23}$ and $Ar_{24}$ include phenyl group, naphthyl group, anthryl group and the like, which may be substituted with methyl group, ethyl group or propyl group.

$Ar_{23}$ and $Ar_{24}$ in the general formula (13) are independently an aromatic amine group represented by the general formula (8) or an arylene ethenylene group represented by the general formula (9).

The third hole transporting polymer of the present invention is the second hole transporting polymer which contains at least one group represented by the above general formula (12) in an amount of from 10% by mole to 150% by mole based on the total silicon atoms belonging to said hole transporting polymer except silicon atoms contained in said group, and the content of the hydroxyl group is less than 10% by mole, preferably less than 5% by mole, more preferably less than 1% by mole, based on the total silicon atoms belonging to said hole transporting polymer except silicon atoms contained in said group.

The third hole transporting polymer of the present invention has been improved in durability.

Examples of the structural unit contained in the second hole transporting polymer or the third hole transporting polymer include the structural unit represented following formula (s1) and (s2).

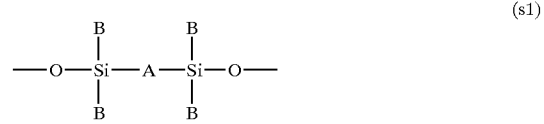

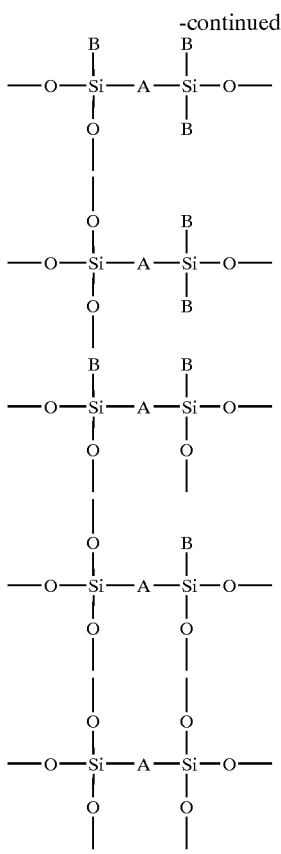

In the formula, A represents an aromatic amine group in the repeating structural unit represented by the general formula (5). B represents any one of $R_8$ to $R_{11}$ in the general formula (5), or the group represented by the general formula (12).

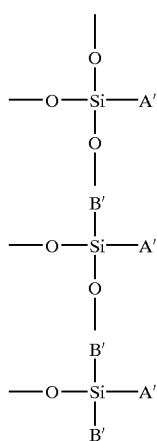

(s2)

In the formula, A' represents an aromatic amine group in the repeating structural unit represented by the general formula (10). B' represents $R_{19}$ or $R_{20}$ in the general formula (10) or the group represented by the general formula (12).

The method of producing the first hole transporting polymer of the present invention is characterized by hydrolyzing and condensing at least one silane compound represented by the above general formula (14), and specific examples thereof include method of hydrolyzing and condensing in the presence or absence of a solvent under an acidic or basic condition.

A mixture obtained by mixing a silane compound represented by the above general formula (14) with one or more of a silane compound represented by the following general formula (23) may be hydrolyzed and condensed.

(23)

wherein X represents a halogen atom or an alkoxy group having 1 to 6 carbon atoms; and R" represents an alkyl or aryl group having 1 to 12 carbon atoms, which may be the same or different.

As the hydrolysis condition, a basic condition is preferred. The base used to give the basic condition is not specifically limited, and inorganic and organic bases can be used. Among them, an organic base is particularly preferred. The solvent may be any one which can dissolve the above silane compounds, and is preferably an organic solvent having high polarity, such as ether solvent, amine solvent or the like. A mixed solvent of two or more kinds can also be used. The reaction temperature is usually in the range of from 0 to 150° C., preferably from 40 to 100° C. The reaction time, depending on a silane compound which is hydrolyzed and condensed, is normally from 30 minutes to 100 hours.

In the general formula (14), X is a halogen atom or a straight-chain or branched alkoxy group having 1 to 20 carbon atoms, preferably a halogen atom or a straight-chain or branched alkoxy group having 1 to 10 carbon atoms, and more preferably a halogen atom or a straight-chain or branched alkoxy group having 1 to 3 carbon atoms.

Specific examples of X include halogen atom such as iodine, bromine, chlorine, fluorine or the like; and alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group or the like.

Preferable group for $R_1$, $Ar_1$, $Ar_2$ and $Ar_3$ in the general formula (14) and specific examples thereof are the same as those for $R_1$, $Ar_1$, $Ar_2$ and $Ar_3$ in the general formula (1), and a ring may be formed between $Ar_1$ and $Ar_2$, $Ar_1$ and $Ar_3$, or $Ar_2$ and $Ar_3$.

The method of synthesizing the silane compound represented by the above general formula (14) is not specifically limited, and specific examples thereof include method of obtaining the silane compound by the methasesis reaction between an alkylhalosilane, alkylalkoxysilane or alkylhaloalkoxysilane compound, and a Grignard reagent or a lithium reagent of an organic compound.

The method of producing the second hole transporting polymer of the present invention is characterized by hydrolyzing and condensing at least one silane compound represented by the above general formula (15), or a mixture of at least one silane compound represented by the above general formula (15) and at least one silane compound represented by the above general formula (16), and specific examples thereof include method of hydrolyzing and condensing in the presence or absence of a solvent under an acidic or basic condition.

A silane compound represented by the general formula (15) or a mixture of a silane compound represented by the general formula (15) and a silane compound represented by the above general formula (16) may be hydrolyzed and condensed in the presence of a silane compound having an alkoxy group or a halogen atom, other than the above silane compound.

As the hydrolysis condition, a basic condition is preferred. The base used to give the basic condition is not specifically limited, and inorganic and organic bases can be used. Among them, an organic base is particularly preferred. Examples of an organic base include diethyl amine, triethyl amine, butylamine, dibutylamine, tributylamine and pyridine. The solvent may be any one which can dissolve the above silane compounds, and is preferably an organic solvent having high polarity, such as ether solvent, amine solvent or the like. A mixed solvent of two or more can also be used. The reaction temperature is usually in the range of from 0 to 150° C., preferably from 40 to 100° C. The reaction time, depending on a silane compound which is hydrolyzed and condensed, is usually from 30 minutes to 100 hours.

In the general formula (15), $R_{30}$, $R_{31}$, $R_{32}$ and $R_{33}$ are independently a halogen atom, a straight-chain or branched alkyl group or alkoxy group having 1–20 carbon atoms, a cycloalkyl group having 3–20 carbon atoms, an aryl group having 6–30 carbon atoms, or an aralkyl group having 7–32 carbon atoms, preferably a halogen atom, a straight-chain or branched alkyl group or alkoxy group having 1–10 carbon atoms or a cycloalkyl group having 3–10 carbon atoms, more preferably a halogen atom,
a straight-chain or branched alkyl group or alkoxy group having 1–6 carbon atoms.

Specific examples of $R_{30}$, $R_{31}$, $R_{32}$ and $R_{33}$ independently include: a halogen atom such as iodine, bromine, chlorine and fluorine; an alkyl group such as methyl group, ethyl group, n-propyl group, isopropyl group, n-butyl group, sec-butyl group, tert-butyl group, pentyl group, hexyl group, heptyl group, octyl group and the like; an alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group and the like; a cycloalkyl group such as cyclopropyl group, cyclobutyl group, cyclopentyl group, cyclohexyl group; an aryl group such as phenyl group, naphtyl group, anthryl group, biphenyl group which may be substituted with methyl group, ethyl group and propyl group; an aralkyl group such as benzyl group, phenetyl group and the like, which may be substituted with methyl group, ethyl group and propyl group.

In the general formula (15), $R_{28}$ and $R_{29}$ independently are a halogen atom or a straight-chain or branched alkoxy group having 1–20 carbon atoms, preferebly a halogen atom, or a straight-chain or branched alkoxy group having 1–10 carbon atoms, more preferably a halogen atom, or a straight-chain or branched alkoxy group having 1–3 carbon atoms.

Specific examples of $R_{28}$ and $R_{29}$ independently include: a halogen atom such as iodine, bromine, chlorine and fluorine; an alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group and the like.

Preferable group for $Ar_{25}$ and $Ar_{27}$ in the general formula (15) and specific examples thereof are the same as those of $Ar_9$ in the general formula (5) or as those of $Ar_{19}$ in the general formula (10).

Preferable group for $Ar_{25}$ and $Ar_{27}$ in the general formula (15) and specific examples thereof are the same as those of $Ar_{10}$ in the general formula (5). A ring may be formed between $Ar_{25}$ and $Ar_{26}$, between $Ar_{25}$ and $Ar_{27}$, or between $Ar_{26}$ and $Ar_{27}$.

In the general formula (16), $R_{35}$ and $R_{36}$ independently are a halogen atom, a straight-chain or branched alkyl group or alkoxy group having 1–20 carbon atoms, a cycloalkyl group having 3–20 carbon atoms, an aryl group having 6–30 carbon atoms, or an aralkyl group having 7–32 carbon atoms, preferably a halogen atom, a straight-chain or branched alkyl group or alkoxy group having 1–10 carbon atoms, or a cycloalkyl group having 3–10 carbon atoms, more preferably a halogen atom, a straight-chain or branched alkyl group or alkoxy group having 1–6 carbon atoms.

Specific example of $R_{35}$ and $R_{36}$ independently include: a halogen atom such as iodine, bromine, chlorine, fluorine; an alkyl group such as methyl group, ethyl group, n-propyl group, isopropyl group, n-butyl group, sec-butyl group, tert-butyl group, a pentyl group, a hexyl group, a heptyl group, an octyl group, and the like; an alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group, and the like; a cycloalkyl group such as cyclopropyl group, cyclobutyl group, cyclopentyl group, cyclohexyl group, and the like; an aryl group such as phenyl group, naphtyl group, anthryl group, biphenyl group, and the like, which may be substituted with methyl group, ethyl group, and propyl group; and an aralkyl group such as benzyl group, phenetyl group, and the like, which may be substituted with methyl group, ethyl group, and propyl group.

In the general formula (16), $R_{34}$ is a halogen atom, or a straight-chain or branched alkoxy group having 1–20 carbon atoms, preferably a halogen atom or a straight-chain or branched alkoxy group having 1–10 carbon atoms, and more preferably a halogen atom, or a straight-chain or branched alkoxy group having 1–3 carbon atoms.

Specific examples of $R_{34}$ include: a halogen atom such as iodine, bromine, chlorine, and fluorine; an alkoxy group such as methoxy group, ethoxy group, n-propoxy group, isopropoxy group, n-butoxy group, sec-butoxy group, tert-butoxy group, pentyloxy group, hexyloxy group, heptyloxy group, octyloxy group, and the like.

In the general formula (16), the arylene group for $Ar_{28}$ is an arylene group having 6–30 carbon atoms, preferably an arylene group having 6–20 carbon atoms, and more preferably a phenylene group or a naphthylene group which may be substituted with a straight-chain or branched alkyl group having 1–6 carbon atoms or a cycloalkyl group having 3–6 carbon atoms.

Specific examples of the arylene group in $Ar_{28}$ include a phenylene group, a naphthylene group, an anthrylene group, and the like, which may be substituted with methyl group, ethyl group, and propyl group.

In the general formula (16), $Ar_{28}$ may be an arylene ethenylene group represented by the general formula (17).

In the general formula (17), $Ar_{31}$ and $Ar_{32}$ are independently an arylene group having 6–30 carbon atoms, preferably an arylene group having 6–20 carbon atoms, and more preferably a phenylene group which may be substituted with a straight-chain or branched alkyl group having 1–6 carbon atoms or a cycloalkyl group having 3–6 carbon atoms.

Specific examples of $Ar_{31}$ and $Ar_{32}$ independently include phenylene group, naphthylene group, anthrylene group, and the like, which may be substituted with methyl group, ethyl group, and propyl group.

In the general formula (17), $R_{37}$ and $R_{38}$ independently are hydrogen atom, a straight-chain or branched alkyl group having 1–20 carbon atoms, a cycloalkyl group having 3–20 carbon atoms, an aryl group having 6–30 carbon atoms, or an aralkyl group having 7–32 carbon atoms, preferably hydrogen atom, a straight-chain or branched alkyl group having 1–10 carbon atoms, a cycloalkyl group having 3–10 carbon atoms, an aryl group having 6–20 carbon atoms, or an aralkyl group having 7–22 carbon atoms, more preferably hydrogen atom, a straight-chain or branched alkyl group having 1–6 carbon atoms, phenyl group which may be substituted with a straight-chain or branched alkyl group having 1–6 carbon atoms, or a cycloalkyl group having 3–6 carbon atoms.

Specific examples of $R_{37}$ and $R_{38}$ independently include hydrogen atom, methyl group, ethyl group, propyl group, and phenyl group which may be substituted with methyl group, ethyl group, and propyl group.

In the general formula (16), the aryl group for $Ar_{29}$ and $Ar_{30}$ independently is an aryl group having 6–30 carbon atoms, preferably an aryl group having 6–20 carbon atoms, more preferably a phenyl group or naphtyl group which may be substituted with a straight-chain or branched alkyl group having 1–6 carbon atoms, or a cycloalkyl group having 3–6 carbon atoms.

Specific examples of the aryl group in $Ar_{29}$ and $Ar_{30}$ include independently, a phenyl group, naphtyl group, anthryl group, and the like, which may be substituted with methyl group, ethyl group, and propyl group.

$Ar_{29}$ and $Ar_{30}$ in the general formula (16) may be an aromatic amine group represented by the general formula (18).

In the general formula (18), $Ar_{33}$ is an arylene group having 6–30 carbon atoms, preferably an arylene group having 6–20 carbon atoms, more preferably a phenylene group or a biphenylene group which may be substituted with a straight-chain or branched alkyl group having 1–6 carbon atoms, or a cycloalkyl group having 3–6 carbon atoms.

Specific examples of $Ar_{33}$ include phenylene group, naphthylene group, anthrylene group, biphenylene group, and the like, which may be substituted with methyl group, ethyl group, and propyl group.

$R_{39}$ and $R_{40}$ in the general formula (18) independently include a straight-chain or branched alkyl group having 1–20 carbon atoms, a cycloalkyl group having 3–20 carbon atoms, an aryl group having 6–30 carbon atoms, and an aralkyl group having 7–32 carbon atoms, preferably a straight-chain or branched alkyl group having 1–10 carbon atoms, a cycloalkyl group having 3–10 carbon atoms, an aryl group having 6–20 carbon atoms, and an aralkyl group having 7–22 carbon atoms, and more preferably a phenyl group or a naphtyl group which may be substituted with a straight-chain or branched alkyl group having 1–6 carbon atoms, or a cycloalkyl group having 3–6 carbon atoms.

Specific examples of $R_{39}$ and $R_{40}$ independently include phenyl group, naphtyl group, anthryl group, biphenyl group, and the like, which may be substituted with methyl group, ethyl group, and propyl group.

In the general formula (18), a ring may be formed between $Ar_{33}$ and $R_{39}$, between $Ar_{33}$ and $R_{40}$, or between $R_{39}$ and $R_{40}$.

$Ar_{29}$ and $Ar_{30}$ in the general formula (16) may be an arylene ethenylene group represented by the general formula (19).

In the general formula (19), $Ar_{34}$ is an arylene group having 6–30 carbon atoms, preferably an arylene group having 6–20 carbon atoms, more preferably a phenylene group which may be substituted with a straight-chain or branched alkyl group having 1–6 carbon atoms, or a cycloalkyl group having 3–6 carbon atoms.

Specific examples of $Ar_{34}$ include a phenylene group, a naphthylene group, an anthrylene group, and the like, which may be substituted with methyl group, ethyl group, and propyl group.

In the general formula (19), $Ar_{34}$ is an aryl group having 6–30 carbon atoms, preferably an aryl group having 6–20 carbon atoms, more preferably a phenyl group which may be substituted with a straight-chain or branched alkyl group having 1–6 carbon atoms, or a cycloalkyl group having 3–6 carbon atoms.

Specific examples of $Ar_{34}$ include a phenyl group, a naphtyl group, an anthryl group, and the like, which may be substituted with methyl group, ethyl group, and propyl group.

In the general formula (19), $R_{41}$ and $R_{42}$ independently include hydrogen atom, a straight-chain or branched alkyl group having and 1–20 carbon atoms, a cycloalkyl group having 3–20 carbon atoms, an aryl group having 6–30 carbon atoms, and an aralkyl group having 7–32 carbon atoms, preferably hydrogen atom, a straight-chain or branched alkyl group having and 1–10 carbon atoms, a cycloalkyl group having 3–10 carbon atoms, an aryl group having 6–20 carbon atoms, and an aralkyl group having 7–22 carbon atoms, more preferably hydrogen atom, a straight-chain or branched alkyl group having 1–6 carbon atoms, a phenyl group which may be substituted with a straight-chain or branched alkyl group having 1–6 carbon atoms or a cycloalkyl group having 3–6 carbon atoms.

Specific examples of $R_{41}$ and $R_{42}$ independently include hydrogen atom, methyl group, ethyl group, and propyl group, or a phenyl group which may be substituted with methyl group, ethyl group, and propyl group. In the general formula (16), a ring may be formed between $Ar_{28}$ and $Ar_{29}$, between $Ar_{28}$ and $Ar_{30}$, or between $Ar_{29}$ and $Ar_{30}$.

The method of synthesizing the silane compounds represented by the above general formula (15) and (16) are not specifically limited, and specific examples thereof include method of obtaining the silane compound by the methasesis reaction between an alkylhalosilane, alkylalkoxysilane or alkylhaloalkoxysilane compound, and a Grignard reagent or a lithium reagent of an organic compound.

The method of producing the second or the third hole transporting polymer of the present invention is characterized by that a silane compound represented by the general formula (20) is reacted with a hole transporting polymer manufactured by the above method of producing the second hole transporting polymer. Specific examples thereof include method of hydrolyzing and condensing in the presence or absence of a solvent under an acidic or basic condition.

As the hydrolysis condition, a basic condition is preferred. The base used to give the basic condition is not specifically limited, and inorganic and organic bases can be used. Among them, an organic base is particularly preferred. Examples of an organic base include diethyl amine, triethyl amine, butylamine, dibutylamine, tributylamine and pyridine. The solvent may be any one which can dissolve the above silane compounds, and is preferably an organic solvent having high polarity, such as ether solvent, amine solvent or the like. A mixed solvent of two or more can also be used.

The reaction temperature is usually in the range of 0 to 150° C., preferably not lower than 20° C. and not higher than 100° C., and more preferably not lower than 40° C. and not higher than 80° C.

In the general formula (20), X is a halogen atom, hydroxyl group or a straight-chain or branched alkoxy group having 1–20 carbon atoms, preferably, a halogen atom, hydroxyl group and more preferably, a halogen atom.

Specific examples of X include: a halogen atom such as iodine, bromine, chlorine, and fluorine; an alkoxy group such as methoxy group, ethoxy group, n-propoxy group, isopropoxy group, n-butoxy group, sec-butoxy group, tert-butoxy group, a pentyloxy group, a hexyloxy group, a heptyloxy group, an octyloxy group, and the like.

Preferable group for $R_{25}$, $R_{26}$, and $R_{27}$ in the general formula (20) and specific examples thereof include the same as those of $R_{25}$, $R_{26}$ and $R_{27}$ in the general formula (12).

The method of synthesizing the silane compound represented by the above general formula (20) is not specifically limited, and specific examples thereof include method of obtaining the silane compound by the methasesis reaction between an alkylhalosilane, alkylalkoxysilane or alkylhaloalkoxysilane compound, and a Grignard reagent or a lithium reagent of an organic compound.

The organic EL device of the present invention will be described hereinafter.

The organic electroluminescence device of the present invention is characterized by [7] an organic electroluminescence device comprising a pair of electrodes of an anode and a cathode, at least one of which is transparent or semitransparent, and at least one layer of an organic material formed between the electrodes, wherein the organic material layer contains the first hole transporting polymer [1], the second hole transporting polymer [2] or the third hole transporting polymer [3].

The organic electroluminescence device of the present invention is characterized by [8] an organic electroluminescence device comprising a pair of electrodes of an anode and a cathode, at least one of which is transparent or semitransparent, and a light emitting layer formed between the electrodes, wherein the light emitting layer contains the first hole transporting polymer [1], the second hole transporting polymer [2], or the third hole transporting polymer [3].

The organic electroluminescence device of the present invention is characterized by [9] an organic electroluminescence device comprising a pair of electrodes of an anode and a cathode, at least one of which is transparent or semitransparent, and a light emitting layer formed between the electrodes, wherein a hole transporting layer containing the first hole transporting polymer [1], the second hole transporting polymer [2], or the third hole transporting polymer [3] is provided adjacent to the light emitting layer between the anode and the light emitting layer.

The organic electroluminescence device of the present invention is characterized by [10] the organic electroluminescence device described in the item [8] or [9], wherein an electron transporting layer containing an electron transporting material is provided adjacent the light emitting layer between the cathode and the light emitting layer.

The organic electroluminescence device of the present invention is characterized by [11] the organic electroluminescence device described in any one of the organic EL device, wherein the light emitting layer contains a light emitting polymer, which contains a repeating structural unit represented by the following general formula (24) in the proportion of 50% by mol based on the total repeating structural units and has a polystyrene-reduced number-average molecular weight of $10^3$ to $10^7$.

$$-Ar-CR=CR' \quad (24)$$

wherein Ar represents an arylene group or a heterocylic compound group having 4 to 20 carbon atoms which take part in a conjugated bond; and R and R' independently represent a group selected from the group consisting of hydrogen atom, alkyl group having 1 to 20 carbon atoms, aryl group having 6 to 20 carbon atoms, heterocyclic compound having 4 to 20 carbon atoms and cyano group.

The structure of the organic EL device of the present invention is not specifically limited, and may be any organic EL device having at least one organic layer between a pair of electrodes of an anode and a cathode, at least one of which is transparent or semitransparent, wherein the organic layer contains the above described hole transporting polymer. Preferred examples of the structure of the organic EL device of the present invention include those wherein a light emitting layer contains the hole transporting polymer, those obtained by layering a light emitting layer on a hole transporting layer containing the hole transporting polymer and providing a pair of electrodes on both surfaces and those obtained by layering an electron transporting layer containing an electron transporting material between a light emitting layer and a cathode. Single or multi-layer of the light emitting layer and charge transporting layer independently may be used.

The following charge transporting material, i.e. electron transporting material or hole transporting material may be contained in the hole transporting layer unless the operation of the hole transporting polymer is inhibited. When the other hole transporting material is mixed with the hole transporting polymer, the amount is not more than 100% by weight, preferably not more than 40% by weight, and most preferably not more than 20% by weight, based on the hole transporting polymer. When the electron transporting material is mixed, the mixing ratio may be appropriately selected considering the luminous efficacy.

The above charge transporting material, which is used alone or in combination thereof in the organic EL device of the present invention, is not specifically limited, and known materials can be used. Examples of the hole transporting material include pyrazoline derivatives, arylamine derivatives, stilbene derivatives, triphenyldiamine derivatives and the like; and examples of the electron transporting material include oxadiazole derivatives, anthraquinodimethane and its derivatives, benzoquinone and its derivatives, naphthoquinone and its derivatives, anthraquinone and its derivatives, tetracyanoanthraquinondimethane and its derivatives, fluorenone derivatives, diphenyldicyanoethylene and its derivatives, diphenoquinone derivatives, metal complex of 8-hydroxyquinoline and its derivatives and the like.

Specific examples thereof include those described in JP-A-63-70257, JP-A-63-175860, JP-A-2-135359, JP-A-2-135361, JP-A-2-209988, JP-A-3-37992 and JP-A-3-152184. Among them, the hole transporting material preferably includes triphenyldiamine derivatives and the electron transporting material preferably includes oxadiazole derivatives, benzoquinone and its derivatives, anthraquinone and its derivatives and metal complex of 8-hydroxyquinoline and its derivatives. More preferably, the hole transporting material includes 4,4'-bis(N(3-methylphenyl)-N-phenylamino) biphenyl and the electron transporting material includes 2-(4-biphenylyl)-5-(4-t-butylphenyl)-1,3,4-oxadiazole, benzoquinone, anthraquinone and tris(8-quinolinol) aluminum.

Among them, the compound of the electron transporting material and/or the compound of the hole transporting material may be used. These electron transporting materials and hole transporting materials may be used alone or in combination thereof.

When the hole transporting layer is provided adjacent to the light emitting layer and the electron transporting layer is further provided adjacent to the light emitting layer between the light emitting layer and cathode, the electron transporting layer may be formed by using the above electron transporting material. When the second hole transporting layer is provided between the hole transporting layer and anode, the second hole transporting layer may be formed by using the above hole transporting material.

When the above described charge transporting material and light emitting material are used in combination, the amount of the charge transporting material used varies depending on the kind of the compound to be used. Therefore, the amount may be appropriately decided unless sufficient film forming property and light emitting characteristics are inhibited. The amount of the charge transporting material is normally from 1 to 40% by weight, and preferably from 2 to 30% by weight, based on the light emitting material.

The known light emitting material, which can be used in the light emitting layer of the organic EL device of the present invention, is not specifically limited. As the low molecular weight compound, for example, there can be used naphthalene derivatives, anthracene and its derivatives, perylene and its derivatives, polymethine dyes, xanthene dyes, coumarin dyes and cyanine dyes; and metal complex of 8-hydroquinoline and its derivatives, aromatic amine, tetraphenylcyclopentadiene and its derivatives, and tetraphenylbutadiene and its derivatives. Specific examples thereof include known light emitting materials such as those described in JP-A-57-51781 and JP-A-59-194393.

As the polymeric compound, for example, there can be used conjugated light emitting polymers such as poly(p-phenylene) and its derivatives, poly(p-phenylenevinylene) and its derivatives, polyfluorene and its derivatives, polyquinoline and its derivatives, polyquinoxaline and its derivatives and the like. Specific examples thereof include known light emitting polymers such as those described in JP-A-5-202355 and JP-A-5-320635, JP-A-7-97569, JP-A-7-147190, JP-A-7-278276 and JP-A-7-300580.

As the light emitting material contained in the light emitting layer of the organic EL device of the present invention, the light emitting polymer is preferred. Examples of the light emitting polymer include light emitting polymer as polyarylenevinylene and its derivatives, which contains the repeating unit represented by the above general formula (24) in the proportion of not less than 50% by mol based on the total repeating structural units and has a polystyrene-reduced number-average molecular weight of $10^3$ to $10^7$. Depending on the structure of the repeating unit, the proportion of the repeating unit represented by the above general formula (24) is preferably not less than 70% by mol based on the total repeating structural units. The light emitting polymer may contain a divalent aromatic compound group or its derivatives, a divalent heterocyclic compound or its derivatives, or a group obtained by using them in combination as the repeating unit represented by the above general formula (24). The repeating unit represented by the above general formula (24) may be bonded in a non-conjugated unit having an ether group, an ester group, an amide group, an imide group or the like. Alternatively, the non-conjugated portion may be contained in the repeating unit.

When a light emitting material is a light emitting polymer which contains the repeating unit of the general formula (24), Ar of the general formula (24) includes arylene or heterocyclic compound group having 4 to 20 carbon atoms which take part in the conjugated bond.

Examples of Ar are described in JP-10-46138, specifically. Among them, phenylene group, substituted phenylene group, biphenylene group, substituted biphenylene group, naphthalenediyl group, substituted naphthalenediyl group, anthracene-9,10-diyl group, substituted anthracene-9,10-diyl group, pyridine-2,5-diyl group, thienylene group or substituted thienylene group is preferable. More preferable groups are phenylene group, biphenylene group, naphthalenediyl group, pyridine-2,5-diyl and thienylene group.

When R and R' of the general formula (24) is a group other than hydrogen a cyano group, examples of R and R' include the alkyl group having 1 to 20 carbon atoms such as methyl group, ethyl group, propyl group, butyl group, pentyl group, hexyl group, heptyl group, octyl group, decyl group, lauryl group and the like, preferably methyl group, ethyl group, pentyl group, hexyl group, heptyl group and octyl group.

Examples of R and R' include an aryl group such as phenyl group, 4-$C_{1-12}$ alkoxyphenyl group ($C_{1-12}$ shows 1 to 12 carbon atoms, the same rule applies correspondingly to the following), 4-$C_{1-12}$alkylphenyl group, 1-naphthyl group, 2-naphthyl group and the like.

In view of the solvent solubility, Ar of the general formula (24) is preferably substituted with a group selected from the group consisting of alkyl, alkoxy or alkylthio group having 4 to 20 carbon atoms, aryl or aryloxy group having 6 to 18 carbon atoms, and heterocyclic compound group having 4 to 14 carbon atoms.

Examples of the substituent are as follows. Examples of the alkyl group having 4 to 20 carbon atoms include butyl group, pentyl group, hexyl group, heptyl group, octyl group, decyl group, lauryl group and the like, preferably pentyl group, hexyl group, heptyl group and octyl group.

Examples of the alkoxy group having 4 to 20 carbon atoms include butoxy group, pentyloxy group, hexyloxy group, heptyloxy group, octyloxy group, decyloxy group, lauryloxy group and the like, preferably pentyloxy group, hexyoxyl group, heptyloxy group and octyloxy group.

Examples of the alkylthio group include butylthio group, pentylthio group, hexylthio group, heptylthio group, octylthio group, decylthio group, laurylthio group and the like, preferably pentylthio group, hexylthio group, heptylthio group and octylthio group.

Examples of the aryl group include phenyl group, 4-$C_{1-12}$ alkoxyphenyl group, 4-$C_{1-12}$alkylphenyl group, 1-naphthyl group, 2-naphthyl group and the like.

Examples of the aryloxy group include phenoxy group. Examples of the heterocyclic compound group include 2-thienyl group, 2-pyrrolyl group, 2-furyl group, 2-, 3- or 4-pyridyl group and the like.

The number of these substituents varies depending on the molecular weight of the light emitting polymer and construction of the repeating unit. In order to obtain a light emitting polymer having high solubility, the number of these substituents is preferably at least one per molecular weight of 600.

The method of synthesizing the light emitting polymer is not specifically limited, and examples thereof include method described in JP-A-5-202355.

The light emitting polymer used in the organic EL device of the present invention may be a random block or graft copolymer, or a polymer having an intermediate construction of them, e.g. a random copolymer having block polymer tendency. In order to obtain a light emitting polymer having high quantum yield of fluorescence, the random copolymer having a block polymer tendency, or block or graft copolymer is better than the perfect random copolymer.

Since the organic EL device of the present invention utilizes light emission from a thin film, a light emitting polymer having luminescence at the solid state is used.

Examples of the good solvent to the light emitting polymer include chloroform, methylene chloride, dichloroethane, tetrahydrofuran, toluene, xylene and the like. The light emitting polymer can be normally dissolved in these solvents in an amount of not less than 0.1% by weight, although it varies depending on the structure or molecular weight of the light emitting polymer.

The polystyrene-reduced molecular weight of the light emitting polymer used in the organic EL device of the present invention is preferably within the range from $10^3$ to $10^7$, and the preferable polymerization degree depends on the repeated structure and it's proportion. In view of the film forming property, the total number of the repeated structures is preferably within the range from 4 to 10000, more preferably from 5 to 3000, and particularly from 10 to 200.

When these light emitting polymers are used as the light emitting material of the organic EL device, since the purity exerts an influence on light emitting characteristics, the light emitting polymer is preferably purified by reprecipitation, separation by means of chromatography or the like, after synthesis.

Next, a typical method of fabricating the organic EL device of the present invention will be described. As the pair of transparent or semitransparent electrodes composed of the anode and cathode, for example, those obtained by forming a transparent or semitransparent electrode on a transparent substrate such as glass, transparent plastic or the like can be used.

As the material of the anode, for example, there can be used conductive metal oxide films, semitransparent metal thin films and the like. Specifically, films of indium-tin oxide (ITO), tin oxide, zinc oxide, Au, Pt, Ag, Cu and the like are used. Examples of the production method include vacuum deposition method, sputtering method, plating method and the like.

A hole transporting layer containing a hole transporting polymer of the present invention as a hole transporting material is formed on the anode. Example of the method of forming the hole transporting layer containing the hole transporting polymer of the present invention include method of applying a melt, a solution or a mixed solution of a hole transporting material containing the hole transporting polymer, using an coating method such as spin coating method, casting method, dipping method, bar coating method, roll coating method or the like.

A film thickness of the hole transporting layer is preferably within the range from 0.5 nm to 10 μm, and more preferably from 1 nm to 1 μm. In order to enhance the luminous efficacy by increasing the current density, the film thickness is preferably within the range from 10 to 800 nm.

Then, a light emitting layer containing a light emitting material is formed. Examples of the method of forming the light emitting layer include a coating method such as method of vacuum deposition in the powdered state of these materials, method of applying a melt, a solution or a mixed solution of these materials by a spin coating method, a casting method, a dipping method, a bar coating method or roll coating method or the like. In case of using the low molecular weight compound, the vacuum deposition method is preferred. In case of using the polymeric compound, the method of applying a solution or a mixed solution by a spin coating method, a casting method, a dipping method, a bar coating method or roll coating method is preferred.

A film thickness of the light emitting layer is preferably within the range from 0.5 nm to 10 μm, and more preferably from 1 nm to 1 μm. In-order to enhance the luminous efficacy by increasing the current density, the film thickness is preferably within the range from 10 to 500 nm.

When a thin film of the hole transporting layer and/or that of light emitting layer are formed by the coating method, it is preferable to dry with heating at a temperature within the range from 30 to 300° C., and preferably from 60 to 200° C., under reduced pressure or an inert atmosphere so as to remove the solvent after formation of the hole transporting layer and/or light emitting layer.

When an electron transporting layer is further layered on the light emitting layer, it is preferable to form the electron transporting layer after the light emitting layer was formed by the above-described film forming method.

The method of forming the film of the electron transporting layer is not specifically limited, and there can be used vacuum deposition method in the powder state; coating method such as spin coating method, casting method, dipping method, bar coating method, roll coating method, etc. after dissolving in the solution; or coating method such as spin coating method, casting method, dipping method, bar coating method, roll coating method, etc. after mixing a binder resin with an electron transporting material in the solution or molten state.

A binder resin to be mixed is not specifically limited, but those which do not inhibit electron transport are preferable. Those whose absorption to visible light is not strong are preferably used.

Examples thereof include poly(N-vinylcarbazole) and its derivatives, polyaniline and its derivatives, polythiophene and its derivatives, poly(p-phenylenevinylene) and its derivatives, poly(2,5-thienylenevinylene) and its derivatives, polycarbonate, polyacrylate, polymethyl acrylate, polymethyl methacrylate, polystyrene, polyvinyl chloride, polysiloxane and the like. It is preferable to use the coating method when using the polymeric compound because a film can be easily formed.

A film thickness of the electron transporting layer must be a thickness so that no pin hole is formed. When the film thickness is too large, the resistance of the device increase to require high driving voltage, unfavorably. Accordingly, the film thickness of the electron transporting layer is preferably within the range from 0.5 nm to 10 μm, more preferably from 1 to 1 μm, and particularly from 5 to 200 nm.

Then, an electrode is formed on the light emitting layer or the electron transporting layer. This electrode serves as an electron injection cathode. The material is not specifically limited, but a material having small work function is preferable. For example, there can be used Al, In, Mg, Ca, Li, Mg—Ag alloy, In—Ag alloy, Mg—In alloy, Mg—Al alloy, Mg—Li alloy, Al—Li alloy, graphite thin film and the like. As the method of producing the cathode, there can be used vacuum deposition method, sputtering method and the like.

EXAMPLES

The following Examples further illustrate the present invention in detail but are not to be construed to limit the scope thereof.

In the following Examples, the molecular weight of the polymer, e.g. polystyrene-reduced number-average molecular weight and polystyrene-reduced weight-average molecular weight, was measured by gel permeation chromatography (Wasters Co., Maxima-820). Structural analysis was performed by using nuclear magnetic resonance absorption spectrum (1H, $^{13}$C-NMR manufactured by Bruker Co., Model AC200P), mass spectrum (FD-MS, mass analyzer manufactured by JEOL Ltd., Model JMS-SX102) and infrared absorption spectrum (1R, manufactured by Nippon BIORAD Co.).

Reference Example 1

Synthesis of ethyl(4-(2'-(4"-(N,N-diphenylamino) phenyl)ethenyl)phenyl)dichlorosilane Under a dry argon atmosphere, n-butyllithium/n-hexane was added dropwise to a dry tetrahydrofuran solution of the above 4-(2'-(4"-(N,N-diphenylamino)phenyl)ethenyl) bromobenzene, and 4-(2'-(4"-(N,N-diphenylamino)phenyl) ethenyl)phenyllithium was prepared.

Under a dry argon atmosphere, a solution of the above 4-(2'-(4"-(N,N-diphenylamino)phenyl)ethenyl) phenyllithium was added dropwise to a dry tetrahydrofuran solution of distilled ethyltrichlorosilane (3.3 g) at −78° C. After stirring at −78° C. for one hour, the temperature was returned to room temperature. After the excess ethyltrichlorosilane and solvent were distilled off, dry toluene was added and a lithium salt was removed by using a glass filter under a dry argon atmosphere. It was confirmed by nuclear magnetic resonance spectrum ($^1$H-NMR) of the resulting reaction product and mass spectrum (FD-MS) of a methoxy derivative [ethyl(4-(2'-(4"-(N,N-diphenylamino)phenyl) ethyenyl)phenyl)dimethoxysilane] that ethyl(4-(2'-(4"-(N, N-diphenylamino)phenyl)ethenyl)phenyl)dichlorosilane) is produced.

$^1$H-NMR: 1.15 [t] (ethyl group), 1.34 [q] (ethyl group), 7.0–7.7 μm] (aromatic group)

FD-MS: m/Z 465

Example 1

Synthesis of Hole Transporting Polymer 1

To a dry toluene solution of ethyl(4-(2'-(4"-(N,N-diphenylamino)phenyl)ethenyl)phenyl)dichlorosilane, 2 ml of triethylamine was added and 3 ml of a mixed solution of triethylamine and methanol was further added. After the solvent was distilled off, the mixture was dissolved in 50 ml of toluene and the solution was washed with an aqueous solution of 1N potassium hydroxide using a separatory funnel. Then, the toluene layer was separated and the solvent was distilled off. The resulting solid was purified by reprecipitation with ethanol/tetrahydrofuran to obtain 2.7 g of a white solid. Hereinafter, this white solid is referred to as a "hole transporting polymer 1".

In infrared absorption spectrum of the resulting hole transporting polymer 1, broad signals derived from a siloxane bond were observed at about 1100 cm$^{-1}$ and 800 cm$^{-1}$. In nuclear magnetic resonance absorption spectrum ($^1$H-NMR), a broad signal of ethyl group bonded to a silicon atom was observed at about 0.7–1.0 ppm and a broad signal of aromatic protons was observed at about 6.4–7.6 ppm, the ratio of integrated intensities of these signals is about 1:4. Thus, it was confirmed that 4-(2'-(4"-(N,N-diphenylamino) phenyl)ethenyl)phenyl group is incorporated into the resulting polymer as a part of the repeating unit. The molecular weight of the hole transporting polymer 1 was measured by gel permeation chromatography. As a result, the polystyrene-reduced weight-average molecular weight was $1.3 \times 10^4$ and the polystyrene-reduced number-average molecular weight was $7.1 \times 10^3$.

Reference Example 2

Bromination of N,N-diphenyl-N',N'-bis(3"-methylphenyl)-1,1'-biphenyl-4,4'-diamine N,N-diphenyl-N',N'-bis(3"-methylphenyl)-1,1'-biphenyl-4,4'-diamine was brominated with N-bromosuccinimide in N,N-dimethylformamide. It was confirmed by mass spectrum that a dibromo derivative of N,N-diphenyl-N',N'-bis (3"-methylphenyl)-1,1'-biphenyl-4,4'-diamine is produced.

Synthesis of Silane Compound 1

In the same manner as that described in Reference Example 1, a dibromo derivatives of N,N-diphenyl-N',N'-bis(3"-methylphenyl)-1,1'-biphenyl-4,4'-diamine was lithiated by using a n-butyllithium/n-hexane solution in a dry tetrahydrofuran solution at −78° C. under a dry argon atmosphere, and then reacted with chloroetrithoxysilane. It was confirmed by mass spectrum (FD-MS) and nuclear magnetic resonance spectrum ($^1$H-NMR) of the resulting reaction product that a triethoxysilyl derivative and a bis (triethoxysilyl) derivative of N,N-diphenyl-N',N'-bis(3"-methylphenyl)-1,1'-biphenyl-4,4'-diamine are produced. Hereinafter, this derivatives is referred to as a "silane compound 1".

$^1$H-NMR: 1.26 [t] (ethoxy group), 2.26 [s] (methyl group), 2.39 [s] (methyl group), 3.88 [q] (ethoxy group), 6.8–7.6 [m] (aromatic group) FD-MS: m/Z 678 (triethoxysilyl derivatives), 840 (bis(triethoxysilyl) derivatives)

Example 2

Synthesis of Hole Transporting Polymer 2

To a tetrahydrofuran solution of the silane compound 1 (about 4 g), 200 μl of triethylamine and 100 μl of water were added with stirring. After the solvent was distilled off, the mixture was purified by reprecipitation with tetrahydrofuran/2-propanol to obtain 0.90 g of a white solid. Hereinafter, this white solid is referred to as a "hole transporting polymer 2".

In infrared absorption spectrum of the resulting hole transporting polymer 2, broad signals derived from a siloxane bond were observed at about 1100 cm$^{-1}$ and 800 cm$^{-1}$. In nuclear magnetic resonance absorption spectrum ($^1$H-NMR), a broad signal of methyl group on phenyl ring was observed at about 1.8–2.4 ppm and a broad signal of aromatic protons was observed at about 6.2–7.6 ppm. Thus, it was confirmed that N,N-diphenyl-N',N'-bis(3"-methylphenyl)-1,1'-biphenyl-4,4'-diamine group is incorporated into the resulting polymer as a part of the repeating unit. The molecular weight of the hole transporting polymer 2 was measured by gel permeation chromatography. As a result, the polystyrene-reduced weight-average molecular weight was $4.8 \times 10^5$ and the polystyrene-reduced number-average molecular weight was $9.2 \times 10^3$.

Reference Example 3

Bromination of N,N,N',N'-tetraphenyl-1,1'-biphenyl-4,4'-diamine

In the same manner as that described in Reference Example 2, N,N,N',N'-tetraphenyl-1,1'-biphenyl-4,4'-diamine was brominated.

Synthesis of Silane Compound 2

In the same manner as that described in Reference Example 2, the above dibromo derivatives was lithiated by using a n-butyllithium/n-hexane solution in a dry tetrahydrofuran solution at −78° C. under a dry argon atmosphere, and then reacted with chlorotriethoxysilane. Hereinafter, the resultant is referred to as a "silane compound 2".

Example 3

Synthesis of Hole Transporting Polymer 3

To a toluene solution of the silane compound 2 (0.5 g), about 50 μl of tetrahydrofuran and 10 μl 1 of water were added with stirring. After the solvent was distilled off, the mixture was purified by reprecipitation with tetrahydrofuran/2-propanol to obtain 0.10 g of a white solid. Hereinafter, this white solid is referred to as a "hole transporting polymer 3".

In infrared absorption spectrum of the resulting hole transporting polymer 3, broad signals derived from a siloxane bond were observed at about 1100 cm$^{-1}$ and 800 cm$^{-1}$. In nuclear magnetic resonance absorption spectrum ($^1$H-NMR), a broad signal of aromatic protons was observed at about 6.4–7.6 ppm. Thus, it was confirmed that N,N,N',N'-tetraphenyl-1,1'-biphenyl-4,4'-diamine group is incorporated into the resulting polymer as a part of the repeating unit. The molecular weight of the hole transporting polymer 3 was measured by gel permeation chromatography. As a result, the polystyrene-reduced weight-average molecular weight was $2.3 \times 10^4$ and the polystyrene-reduced number-average molecular weight was $2.8 \times 10^3$.

Example 4

Fabrication and Evaluation of Device Using Hole Transporting Polymer 1

Using a toluene solution of the hole transporting polymer 1 obtained in Example 1, a film was formed in a thickness of 60 nm by spin coating on a glass substrate on which an ITO film was built up in a thickness of 200 nm according to a sputtering method. A uniform film was obtained. After the film was dry at 120° C. under reduced pressure for one hour, tris(8-quinolinol)aluminum (Alq$_3$) was deposited in a thickness of 70 nm at a rate of 0.1 to 0.2 nm/second as a light emitting/electron transporting layer. Finally, an aluminum-lithium alloy (Al:Li=about 200:1 in weight ratio) was deposited thereon in a thickness of 100 nm as a cathode to fabricate an organic EL device. The vacuum degree during the deposition was $1 \times 10^{-5}$ Torr or less.

Regarding this device, the luminance reached 1 cd/m$^2$ or more at the applied voltage of 4.0 V and a current having a current density of 8.8 mA/cm$^2$ flowed at 6.5 V. Thus, emission of uniform green EL light having a luminance of 230 cd/m$^2$ was observed. At this time, the luminous efficacy was 2.60 cd/A. The luminance was nearly proportional to the current density. Emission of EL light from Alq$_3$ was confirmed by the fact that the EL spectrum nearly agreed with a fluorescent spectrum of a thin film of Alq$_3$.

Example 5

Fabrication and Evaluation of Device Using Hole Transporting Polymer 3

In the same manner as that described in Example 4, except for using the hole transporting polymer 3 in place of the hole transporting polymer 1, an organic EL device was fabricated.

Regarding this device, the luminance reached 1 cd/m$^2$ or more at the applied voltage of 5.0 V and a current having a current density of 9.2 mA/cm$^2$ flowed at 8.5 V. Thus, emission of uniform green EL light having a luminance of 194 cd/m$^2$ was observed. At this time, the luminous efficacy was 2.12 cd/A. The luminance was nearly proportional to the current density. Emission of EL light from Alq$_3$ was confirmed by the fact that the EL spectrum nearly agreed with a fluorescent spectrum of a thin film of Alq$_3$.

This device was continuously driven in a nitrogen flow at a current density of 25 mA/cm$^2$. As a result, a driving voltage was increased slightly from 7.7 V to 9.2 V after 30 hours.

Reference Example 4

Synthesis of Light Emitting Polymer 1

2,5-dioctyloxy-p-xylylene dichoride was reacted with triphenylphosphine in a N,N-dimethylformamide solvent to synthesize a phosphonium salt. 47.78 g of the resulting phosphonium salt and 5.5 g of terephthalaldehyde were dissolved in an ethyl alcohol/chloroform mixed solvent. An ethyl alcohol/chloroform mixed solution containing 5.4 g of lithium ethoxide was added dropwise to an ethyl alcohol of a phosphonium salt and dialdehyde, followed by polymerization. To the resulting reaction solution, a chloroform solution of 1-pyrenecarboxaldehyde was added and an ethyl alcohol solution containing lithium ethoxide was further added dropwise, and then the mixed solution was polymerized at room temperature for 3 hours. After the reaction solution was allowed to stand at room temperature overnight, the precipitate was collected by filtration and the precipitate was washed with ethyl alcohol and dissolved in chloroform. Ethanol was added to the solution to form a precipitate again. The precipitate was dry to obtain 8.0 parts by weight of a polymer.

This polymer is referred to as a "light emitting polymer 1". A repeating unit of the light emitting polymer 1 calculated from a charging ratio of monomers, and its molar ratio are shown below. It was confirmed by $^1$H-NMR that the polymer has a pyrenyl group at the molecular terminal.

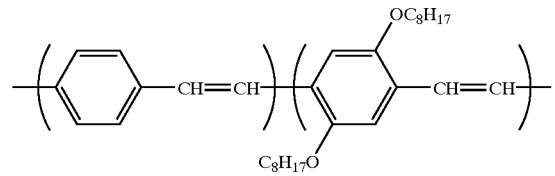

wherein a molar ratio of two repeating units is 50:50 and two repeating units are bonded each other.

The polystyrene-reduced number-average molecular weight of the light emitting polymer 1 was $4.0 \times 10^3$. The structure of the light emitting polymer 1 was confirmed by infrared absorption spectrum and NMR.

Example 6

Fabrication and Evaluation of Device Using Hole Transporting Polymer 1

Using a toluene solution of the hole transporting polymer 1 obtained in Example 1, a film was formed in a thickness of 55 nm by spin coating on a glass substrate on which an ITO film was built up in a thickness of 200 nm according to a sputtering method. A uniform film was obtained. On this film, a 2% decalin solution of the light emitting polymer 1 obtained in Reference Example 4 was spin-coated. Then, tris(8-quinolinol)aluminum (Alq$_3$) was deposited in a thickness of 50 nm at a rate of 0.1 to 0.2 nm/second as an electron transporting layer. Finally, an aluminum-lithium alloy (Al:Li=about 200:1 in weight ratio) was deposited thereon in a thickness of 40 nm as a cathode to fabricate an organic EL device. The vacuum degree during the deposition was $1 \times 10^{-5}$ Torr or less.

Regarding this device, the luminance reached 1 cd/m$^2$ or more at the applied voltage of 5.5 V and emission of uniform yellowish green EL light having a luminance of 100 cd/m$^2$ at 8.3 V was observed. At this time, the luminous efficacy was 3.0 cd/A. The luminance was nearly proportional to the current density. Emission of EL light from light emitting polymer 1 was confirmed by the fact that the EL spectrum nearly agreed with a fluorescent spectrum of a thin film of light emitting polymer 1.

This device was continuously driven in a nitrogen flow at a current density of 25 mA/cm$^2$. As a result, the luminance was 549 cd/m$^2$ at first, but the luminance was about 210 cd/m$^2$ even after 50 hours. The driving voltage was increased from 11 V to 18 V during this time.

Example 7

Fabrication and Evaluation of Device Using Hole Transporting Polymer 2

In the same manner as that described in Example 6, except for using the hole transporting polymer 2 in place of the hole transporting polymer 1, a device was fabricated. At this time, the film thickness of the hole transporting polymer 2 was about 25 nm.

Regarding this device, the luminance reached 1 cd/m$^2$ or more at the applied voltage of 4.25 V and emission of uniform yellowish green EL light having a luminance of 100 cd/m$^2$ at 6.3 V was observed. At this time, the luminous efficacy was 3.0 cd/A. The luminance was nearly proportional to the current density. Emission of EL light from light emitting polymer 1 was confirmed by the fact that the EL spectrum nearly agreed with a fluorescent spectrum of a thin film of light emitting polymer 1.

This device was continuously driven in a nitrogen flow at a current density of 25 mA/cm$^2$ As a result, the luminance was 625 cd/m$^2$ at first, but the luminance was about 503 cd/m$^2$ even after 50 hours. The driving voltage was increased slightly from 7.8 V to 9.7 V during this time.

Comparative Example 1

Fabrication and Evaluation of Device

In the same manner as that described in Example 5, except for forming a film using a methylene chloride solution of polyvinyl carbazole in place of the hole transporting polymer 3 by a dipping method, an organic EL device was fabricated.

Regarding this device, the luminance reached 1 cd/M$^2$ or more at the applied voltage of 4.25 V and a current having a current density of 17.1 mA/cm$^2$ flowed at 6.5 V. Thus, emission of uniform green EL light having a luminance of 288.2 cd/m$^2$ was observed. At this time, the luminous efficacy was 1.68 cd/A. The luminance was nearly proportional to the current density. Emission of EL light from Alq$_3$ was confirmed by the fact that the EL spectrum nearly agreed with a fluorescent spectrum of a thin film of Alq$_3$.

This device was continuously driven in a nitrogen flow at a current density of 25 mA/cm$^2$. As a result, a driving voltage was increased from 5.7 V to 7.8 V after 30 hours.

Comparative Example 2

Fabrication and Evaluation of Device

In the same manner as that described in Example 6, except for forming a film using a methylene chloride solution of polyvinyl carbazole in place of the hole transporting polymer 1 as the hole transporting polymer by a dipping method, an organic EL device was fabricated.

Regarding this device, the luminance reached 1 cd/m$^2$ or more at the applied voltage of 5.0 V and emission of uniform green EL light having a luminance of 100 cd/m$^2$ at 7.6 V was observed. At this time, the luminous efficacy was 3.3 cd/A. The luminance was nearly proportional to the current density.

This device was continuously driven in a nitrogen flow at a current density of 25 mA/cm$^2$. As a result, the luminance was 670 cd/m$^2$ at first, but the luminance was reduced to about 256 cd/m$^2$ after 50 hours and the driving voltage was increased from 11 V to 19.8 V.

Reference Example 5

Synthesis of Silane Compound 3

Under a dry argon atmosphere, n-butyllithium/n-hexane (17 ml) was added dropwise to a dry tetrahydrofuran solution of the dibromo derivative of N,N'-diphenyl-N,N'-bis(3"-methylphenyl)-1,1'-biphenyl-4,4'-diamine (8.0 g) which was prepared as the same manner with Reference Example 2, at −78° C., dilithium-derivative of N,N'-diphenyl-N,N'-bis(3"-methylphenyl)-1,1'-biphenyl-4,4'-diamine was prepared.

Under a dry argon atmosphere, a solution of the above dilithium-derivative of N,N'-diphenyl-N,N'-bis(3"-methylphenyl)-1,1'-biphenyl-4,4'-diamine was added dropwise to a dry tetrahydrofuran solution of dimethoxymethylchlorosilane (7.0 g) at −78° C. After stirring at −78° C. for one hour, the temperature was returned to room temperature. After the excess dimethoxymethylchlorosilane and the solvent were distilled off, dry toluene was added and a lithium salt was removed by using a glass filter under a dry argon atmosphere. After the solvent was distilled, a viscous solid (7.1 g) was obtained. It was confirmed by nuclear magnetic resonance spectrum ($^1$H-NMR) of the resulting reaction product that dimethoxymethylsilyl derivative and bis (dimethoxymethylsilyl) derivative of N,N'-diphenyl-N,N'-bis(3"-methylphenyl)-1,1'-biphenyl-4,4'-diamine were produced. (Hereinafter, referred to as "silane compound 3").

$^1$H-NMR: 0.40[s] (methyl group bonded to silicon atom), 2.28[s] (methyl group), 3.60[s] (methoxy group), 6.8–7.6 [m] (aromatic group).

Example 8

Synthesis of Hole Transporting Polymer 4

To a dry tetrahydrofuran solution of silane compound 3 (6.5 g), 3.5 ml of triethylamine and 0.65 ml of water were added with stirring and further stirring at 60° C. After the solvent was distilled off, the resulting solid was purified by reprecipitation with tetrahydrofuran/2-propanol to obtain 3.17 g of a white solid. Hereinafter, this white solid is referred to as a "hole transporting polymer 4".

In nuclear magnetic resonance spectrum ($^1$H-NMR) of the resulting hole transporting polymer 4, a signal of methyl group bonded to silicon atom at about 0.0–0.7 ppm, a broad signal of methyl group on a phenyl ring at about 1.8–2.4 ppm, a signal of methoxy group at about 3.4–3.7 ppm, and abroad signal of aromatic protons at about 6.2–7.6 ppm were observed.

In infrared absorption spectrum, broad signals derived from a siloxane bond at about 1100 cm$^{-1}$ and 800 cm$^{-1}$ and broad signals derived from hydroxyl group at about 3300 cm$^{-1}$ were observed. It was confirmed that N,N'-diphenyl-N,N'-bis(3"-methylphenyl)-1,1'-biphenyl-4,4'-diamine group was incorporated to the obtained polymer as a part of the repeating units, and a part of hydroxyl groups resulting by hydrolysis remained as unreact. The molecular weight of the hole transporting polymer 4 was measured by gel permeation chromatography. As a result, the polystyrene-reduced weight-average molecular weight was $2.2 \times 10^4$ and the polystyrene-reduced number-average molecular weight was $6.2 \times 10^3$.

Example 9

Synthesis of Hole Transporting Polymer 5

To 15 ml of tetrahydrofuran solution of the hole transporting polymer 4 (1.0 g) synthesized as the same manner with Example 8, 3 ml of triethylamine was added, then 1.7 g of triphenylchlorosilane was added, and stirred at 55° C. Water was added in order to deactivate the excess triphenylchlorosilane. After the solvent was distilled, it was dissolved in toluene, and after washed with water using a separatory funnel, the toluene layer was separated and the solvent was distilled. The resultant solid was purified by reprecipitation with tetrahydrofuran/2-propanol, and 0.85 g of white solids was obtained. Hereafter, this is referred to as a "hole transporting polymer 5".

From integrated intensities of the signal in nuclear-magnetic-resonance absorption spectrum ($^1$H-NMR) of the resultant hole transporting polymer 5, it confirmed that triphenyl silylgroup was incorporated.

In the infrared-absorption spectrum, although strength is weak, a broad signal derived from the hydroxyl group was observed at about 3300 cm$^{-1}$. It was confirmed that the hydroxyl group still remained. The molecular weight of hole transporting polymer 5 was measured by gel permeation chromatography, and polystyrene-reduced weight-average molecular weight was $2.4 \times 10^4$ and the polystyrene-reduced number average molecular weight was $7.9 \times 10^3$.

Synthesis of Hole Transporting Polymer 6

To 20 ml of tetrahydrofuran solution of the above hole transporting polymer 5 (0.65 g), 4 ml of triethylamine was added, then trimethylchlorosilane 0.23 g was added, and stirred at room temperature. After work-up was conducted as the same manner as that of Example 9, the resultant solid was purified by reprecipitation with tetrahydrofuran/ethanol, and 0.62 g of white solids was obtained. Hereafter, this is referred to as a "hole transporting polymer 6".

In the nuclear-magnetic-resonance absorption spectrum of the resultant hole transporting polymer 6 ($^1$H-NMR), methyl signal of trimethylsilyl Group is observed at about −0.1–0.1 ppm, and it confirmed that a trimethylsilyl group was incorporated. A signal was not observed at about 3300 cm$^{-1}$ in infrared-absorption spectrum, and it was confirmed that the hydroxyl group does not remained. The molecular weight of hole transporting polymer 6 was measured by gel permeation chromatography, and the polystyrene reduced weight-average molecular weight was $2.5 \times 10^4$ and the polystyrene-reduced number average molecular weight was $8.1 \times 10^3$.

Example 10

Synthesis of Hole Transporting Polymer 7

To 20 ml of tetrahydrofuran solution of hole transporting polymer 5 (0.65 g) synthesized as the same manner as Example 9, 4 ml of triethylamine was added, then diphenylmethyl chlorosilane 0.43 g was added, and stirred at 55° C. After work-up was conducted as the same manner as that of Example 9, the resultant solid was purified by reprecipitation with tetrahydrofuran/ethanol, and 0.48 g of white solids was obtained. Hereafter, this is referred to as "hole transporting polymer 7".

In the nuclear-magnetic-resonance absorption spectrum of the resultant hole transporting polymer 7 ($^1$H-NMR), a signal of the methyl group of diphenylmethylsilyl group was observed at about 0.4–0.6 ppm, and it was confirmed that a diphenylmethylsilyl group was incorporated. A signal was not observed at about 3300 cm$^{-1}$ in infrared-absorption spectrum, and it was confirmed that the hydroxyl group does not remained. The molecular weight of hole transporting polymer 7 was measured by gel permeation chromatography, and the polystyrene-reduced weight-average molecular weight was $2.9 \times 10^4$ and the number-average molecular weight was $9.5 \times 10^3$.

Reference Example 6

Synthesis of 4-(2'-(1"-pyrenyl)ethenyl) bromobenzene 4-bromobenzyl bromide(product made from Tokyo Kasei) was reacted with triphenyl phosphine in dry acetone solvent, and the phosphonium salt was obtained. To dry ethanol solution of the resultant phosphonium salt 45 g and 1-pyrene carboxy aldehyde (product made from Aldrich Co.) 24.3 g, ethanol solution of lithium ethoxide (obtained by reacting lithium 1.5 g with dry ethanol 100 ml) was added dropwise, and 4-(2'-(1"-pyrenyl) ethenyl)bromobenzene was prepared. It was purified by silica-gel column chromatography and 34.9 g of yellow solid was obtained.

Synthesis of 4-(2'-(1"-pyrenyl)ethenyl) dimethylchloro Silane

As the same manner with Reference Example 1, 4-(2'-(1"-pyrenyl)ethenyl)bromobenzene was lithiated with n-butyl lithium/n-hexane solution in dry tetrahydrofuran solution at −78° C., under dry argon atmosphere, then reacted with dimethyldichlorosilane. By the nuclear-magnetic-resonance spectrum of the resultant product ($^1$H-NMR), it was confirmed that 4-(2'-(1"-pyrenyl)ethenyl) dimethylchlorosilane was formed.

Example 11

Synthesis of Hole Transporting Polymer 8

To 15 ml of tetrahydrofuran solution of the hole transporting polymer 4 (1.0 g) synthesized as the same manner with Example 8, triethylamine 3 ml was added, then 4-(2'-(1"-pyrenyl)ethenyl)dimethylchlorosilane 1.7 g was added, and stirred at room temperature. After work-up as the same manner as that of Example 9, the resultant solid was purified by reprecipitation with tetrahydrofuran/2-propanol, and 0.98 g of white solid was obtained. Hereafter, this is referred to as "hole transporting polymer 8".

In the nuclear-magnetic-resonance absorption spectrum of the resultant hole transporting polymer 8 ($^1$H-NMR), the signal of aromatic protons of 4-(2'-(1"-pyrenyl)ethenyl) dimethylsilyl group was observed at about 7.6–8.5 ppm, and it was confirmed that 4-(2'-(1"-pyrenyl)ethenyl) dimethylsilyl group was incorporated. In the infrared-absorption spectrum, a signal was not observed at about 3300 cm$^{-1}$, and it was confirmed that hydroxyl group does not remained. The molecular weight of hole transporting polymer 8 was measured by gel permeation chromatography, and the polystyrene-reduced weight-average molecular weight was $2.8 \times 10^4$ and the polystyrene-reduced number-average molecular weight was $7.0 \times 10^3$.

Reference Example 7

Synthesis of Light Emitting Polymer 2

2,5-dioctyloxy-p-xylylene dichloride was reacted with triphenyl phosphine in N,N-dimethylformamide solvent, and the phosphonium salt was prepared. 4.78 g of the resultant phosphonium salt, 4.28 g of the phosphonium salt of 2-methoxy-5-octyloxy-p-xylylene dichloride obtained similarly, terephthalaldehyde 1.01 g and 1-pyrenecarboxyaldehyde 1.15 g were dissolved in a mixed solvent of ethanol 80 g/chloroform 10 g.

A mixed solution of a 12% methanol solution of lithium methoxide 10 ml/ethanol 40 ml, was added dropwise to a mixed solution of ethyl alcohol/chloroform of the phosphonium salt and the aldehyde, then further reacted for 4 hours at room temperature. After standing it overnight at room temperature, precipitates were collected and washed with ethyl alcohol. Then the precipitates were dissolved in toluene, and purified by reprecipitation twice with adding ethanol. After drying in a reduced pressure, 2.0 g of light emitting polymer was obtained.

This is referred to as a "light emitting polymer 2". The repeating unit and its molar ratio of the light emitting polymer 2 which is calculated from the charged monomer ratio are shown below.
It was confirmed that pyrenyl group is incorporated to the molecular terminal from $^1$H-NMR.

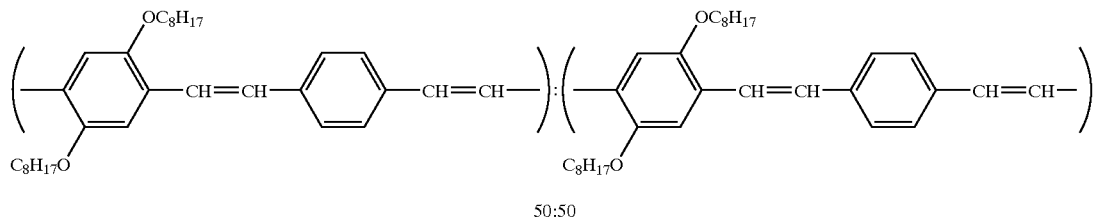

50:50

The polystyrene-reduced number-average molecular weight of this light emitting polymer 2 was $2.5 \times 10^3$. The structure of this light emitting polymer 2 was confirmed by infrared-absorption spectrum and NMR.

Example 12

Fabrication and Evaluation of a Device Using Hole Transporting Polymer 6

To a glass substrate on which ITO film was built up in a thickness of 200 nm according to the sputtering method, a film was formed in a thickness of 60 nm with spin coating with using toluene solution of the resultant hole transporting polymer 6 of Example 9. A uniform film was obtained.

On this film, a 2% decalin solution of the light emitting polymer 2 obtained in Reference Example 7 was spin coated. Subsequently, as an electron transporting layer, tris(8-quinolinol)aluminium ($Alq_3$) was deposited at a rate of 0.1 nm/s in a thickness of 40 nm. Finally, aluminium lithium alloy (Al:Li=about 200:1 in weight ratio) as a cathode was deposited on it in a thickness of 40 nm, and an organic electroluminescence device was fabricated. The vacuum degree during the deposition was always $1 \times 10^{-5}$ Torrs or less.

In the device, the luminance is 1 cd/M$^2$ or more at applied voltage of 3.5V, and yellow green uniform EL luminescence of 100 cd/M$^2$ at 5.25V was observed. The luminous efficacy at this time was 3.09 cd/A. The luminance was almost proportional to a current density.

Emission of EL light from light emitting polymer 2 was confirmed by the fact that the EL spectrum nearly agreed with a fluorescent spectrum of a thin film of light emitting polymer 2.

In continuation driving of this device in nitrogen atmosphere with a current density of 25 mA/cm$^2$, the luminance of early stage is 878 cd/m$^2$, and the luminance after 50 hours was about 513 cd/m$^2$. The driving voltage went up from 6.8V to 14.5V during this time.

Example 13

Fabrication and Evaluation of a Device Using Hole Transporting Polymer 7

The device was fabricated as the same manner with Example 12 except having used the toluene solution of the hole transporting polymer 7 obtained in Example 10 instead of the toluene solution of the hole transporting polymer 6 of Example 12. The film thickness of the hole transporting polymer 7 was 45 nm.
In the device, the luminance is 1 cd/m$^2$ or more at applied voltage of 3.75V, and yellow green uniform EL luminescence of 100 cd/m$^2$ at 5.50V was observed.

The luminous efficacy at this time was 2.06 cd/A. The luminance was almost proportional to a current density.

Emission of EL light from light emitting polymer 2 was confirmed by the fact that the EL spectrum nearly agreed with a fluorescent spectrum of a thin film of light emitting polymer 2.

In continuation driving of this device in nitrogen atmosphere with a current density of 25 mA/cm$^2$, the luminance of early stage is 602 cd/m$^2$, and the luminance after 50 hours was about 451 cd/m$^2$. The driving voltage went up from 6.5V to 11.9V during this time.

Example 14

Fabrication and Evaluation of a Device Using Hole Transporting Polymer 8

The device was fabricated as the same manner with Example 12 except having used the toluene solution of the hole transporting polymer 8 instead of the toluene solution of the hole transporting polymer 6 of Example 12. The film thickness of the hole transporting polymer 8 was 46 nm. In the device, the luminance was 1 cd/m$^2$ or more at applied voltage of 3.50V, and yellow green uniform EL luminescence of 100 cd/m$^2$ at 5.25V was observed.

The luminous efficacy at this time was 2.83 cd/A. The luminance was almost proportional to a current density.

Emission of EL light from light emitting polymer 2 was confirmed by the fact that the EL spectrum nearly agreed with a fluorescent spectrum of a thin film of light emitting polymer.

In continuation driving of this device in nitrogen atmosphere with a current density of 25 mA/cm$^2$, the driving voltage went up from 6.4V to 11.3V during this time.

The hole transporting polymer of the present invention has excellent hole transporting property, and is superior in durability and film-forming property. The organic EL device using the hole transporting polymer has excellent light emitting characteristics in comparison with the conventional art, and its industrial value is great.

What is claimed is:

1. A hole transporting polymer comprising a repeating structural unit represented by the following general formula (1), and having a polystyrene-reduced number-average molecular weight of from $10^3$ to $10^7$:

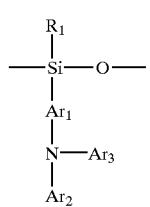
(1)

wherein $R_1$ represents an alkyl group having 1 to 20 carbon atoms, or an aryl group having 6 to 30 carbon atoms; $Ar_1$ represents an arylene group having 6 to 30 carbon atoms, or an arylene ethenylene group represented by the following general formula (2); $Ar_2$ and $Ar_3$ independently represent an aryl group having 6 to 30 carbon atoms, an aromatic amine group represented by the following general formula (3), or an arylene ethenylene group represented by the following general formula (4):

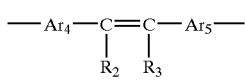
(2)

wherein $Ar_4$ and $Ar_5$ independently represent an arylene group having 6 to 30 carbon atoms; and $R_2$ and $R_3$ independently represent a hydrogen atom, an alkyl group having 1 to 20 carbon atoms, or an aryl group having 6 to 30 carbon atoms:

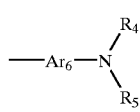
(3)

wherein $Ar_6$ represents an arylene group having 6 to 30 carbon atoms; $R_4$ and $R_5$ independently represent an alkyl group having 1 to 20 carbon atoms, or an aryl group having 6 to 30 carbon atoms,

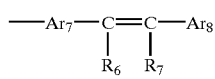
(4)

wherein $Ar_7$ represents an arylene group having 6 to 30 carbon atoms; $R_6$ and $R_7$ independently represent hydrogen atom, an alkyl group having 1 to 20 carbon atoms, or an aryl group having 6 to 30 carbon atoms; $Ar_8$ represents an aryl group having 6 to 30 carbon atoms.

2. A method of producing a hole transporting polymer of claim 1, wherein at least one silane compound represented by the following general formula (14) is hydrolyzed and condensed:

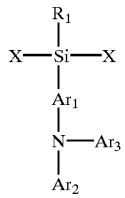
(14)

wherein X represents a halogen atom or an alkoxy group having 1 to 20 carbon atoms; $R_1$, $Ar_1$, $Ar_2$, and $Ar_3$ are as defined in claim 1.

3. An organic electroluminescence device comprising a pair of electrodes of an anode and a cathode, at least one of which is transparent or semitransparent, and a light emitting layer formed between the electrodes, wherein the light emitting layer contains the hole transporting polymer according to claim 1.

4. An organic electroluminescence device comprising a pair of electrodes of an anode and a cathode, at least one of which is transparent or semitransparent, and a light emitting layer formed between the electrodes, wherein a hole transporting layer containing the hole transporting polymer according to claim 1 is provided adjacent to the light emitting layer between the anode and the light emitting layer.

5. The organic electroluminescence device according to claim 3 or 4, wherein an electron transporting layer containing an electron transporting compound is provided adjacent to the light emitting layer between the cathode and the light emitting layer.

6. The organic electroluminescence device according to claim 3 or 4, wherein the light emitting layer contains a light emitting polymer, which contains a repeating structure unit represented by the following general formula (21) in the proportion of 50% by mol or more based on the total repeating structural units and has a polystyrene-reduced number-average molecular weight to $10^3$ to $10^7$,

wherein Ar represents an arylene group or heterocyclic compound group having 4 to 20 carbon atoms, which take part in a conjugated bond; and R and R' independently represent a group selected from the group consisting of a hydrogen atom, an alkyl group having 1 to 20 carbon atoms, aryl group having 6 to 20 carbon atoms, a heterocyclic compound having 4 to 20 carbon atoms and a cyano group.

7. An organic electroluminescence device comprising a pair of electrodes of an anode and a cathode, at least one of which is transparent or semitransparent, and at least one layer of an organic material formed between the electrodes, wherein the organic material layer contains the hole transporting polymer according to claim 1.

* * * * *